(12) United States Patent
Fujiwara

(10) Patent No.: US 6,191,445 B1
(45) Date of Patent: Feb. 20, 2001

(54) NONVOLATILE SEMICONDUCTOR MEMORY DEVICE AND METHOD OF READING A DATA THEREFROM

(75) Inventor: Ichiro Fujiwara, Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/185,580

(22) Filed: Nov. 4, 1998

(30) Foreign Application Priority Data

| Nov. 5, 1997 | (JP) | 9-303112 |
| Mar. 18, 1998 | (JP) | 10-068996 |
| Sep. 25, 1998 | (JP) | 10-272184 |

(51) Int. Cl.$^7$ ............................................. H01L 27/788
(52) U.S. Cl. ............................................. 257/321
(58) Field of Search ............................................. 257/321

(56) References Cited

U.S. PATENT DOCUMENTS

| 5,138,575 | * | 8/1992 | Ema et al. | 365/185 |
| 5,349,221 | | 9/1994 | Shimoji | 257/324 |
| 5,408,429 | * | 4/1995 | Sawada | 365/185 |
| 5,589,700 | | 12/1996 | Nakao | 257/325 |
| 5,627,779 | | 5/1997 | Otake | 365/185.81 |
| 5,850,091 | * | 12/1998 | Li et al. | 257/316 |
| 5,854,766 | * | 12/1998 | Sekiguchi | 365/218 |

FOREIGN PATENT DOCUMENTS

| 0 649 172 | 4/1995 | (EP) . |
| 0 741 389 | 11/1996 | (EP) . |
| 8-036890 | 2/1996 | (JP) . |
| 9-213094 | 8/1997 | (JP) . |

OTHER PUBLICATIONS

Boehm T. et al.: "Development of Sub–Quarter–Mum Monos (Metal/Oxide/Nitride/Oxide/Semiconductor) Type Memory Transistor"; Japanese Journal of Applied Physics, vol. 35, No. 2B, Feb. 1, 1996, pp. 898–901, XP000701007; ISSN: 021–4922.

* cited by examiner

Primary Examiner—Charles Bowers
Assistant Examiner—William M. Brewster
(74) Attorney, Agent, or Firm—Ronald P. Kananen; Rader, Fishman & Grauer

(57) ABSTRACT

A memory cell array is constituted with a plurality of memory transistors having tunnel insulating films made relatively thick arranged in the form of a matrix, a non-selected column bias voltage of a value between a source voltage and a gate voltage when reading the selected transistor M11 is supplied to the source and/or drain of a non-selected column memory transistor M21 arranged in the column not containing the selected memory transistor M11 in an reverse bias polarity to for example a channel forming region, and a voltage of a value between the voltage to be supplied to the gate of the related selected memory transistor M11 when reading and a ground voltage supplied to the source of the selected memory transistor M11. Further, a voltage equivalent to or lower than that for the source of the selected memory transistor M11 is supplied to the gate of the non-selected row.

24 Claims, 25 Drawing Sheets

ESTIMATION OF MINIMUM AREA OF MEMORY CELL (Mm.n)

FINE NOR TYPE CELL

DRAIN VOLTAGE DEPENDENCY OF DRAIN CURRENT, USING SOURCE BIAS VOLTAGE AS A PARAMETER (Vs=0V, 0.15V, 0.3V)

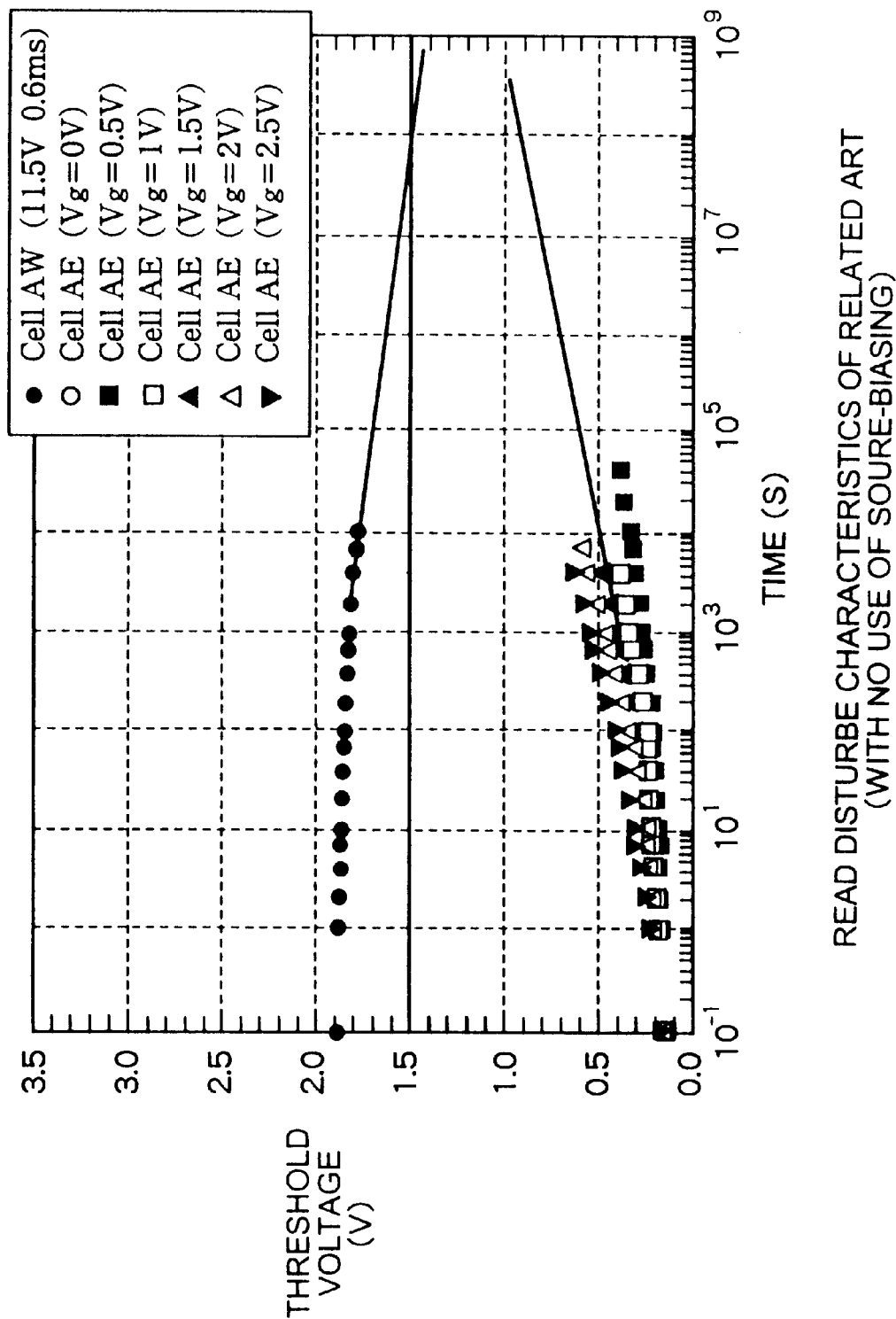

NONVOLATILE SEMICONDUCTOR MEMORY DEVICE AND METHOD OF READING A DATA THEREFROM

BACKGROUND OF THE INVENTION

1. Field of the Invention

The present invention relates to a nonvolatile semiconductor memory device having a charge storing means inside a gate insulating film between a channel forming region and a gate electrode of a memory transistor and having as its basic operation electrically injecting a charge (electrons or holes) into the related charge storing means to store or to extract the charge from the charge storing means and to a method of reading the same.

Specifically, the present invention relates to application of predetermined bias voltages to a source and drain or a gate of a selected memory transistor or non-selected memory transistor which has for example a plenarily dispersed charge storing means or for which a threshold voltage distribution is set narrow so as to supply an inhibit voltage for effectively preventing erroneous reading of the selected memory transistor and the non-selected memory transistor at the time of reading to the selected memory transistor and so as to control the threshold voltage in an erased state.

2. Description of the Related Art

In an advanced information society such as a high speed and wide area network society, there is a large need for large capacity file memories and large capacity AV use memories. At the present time, as large capacity memory systems for storing one gigabyte (GB) or more of data, disk memory systems using hard disks, optical disks, and other disks as the recording media have been used. There has been active research for replacing this big market with nonvolatile semiconductor memories in recent years.

However, while a nonvolatile semiconductor memory matches with the trend toward reduction of size and reduction of weight of hardware, the memory bit capacity is still insufficient at the present time and nonvolatile semiconductor memory (flash memory) having a large capacity of 1 gigabit (Gb) or more has yet been implemented. Further, in the above nonvolatile semiconductor memory, in addition to the insufficient storage capacity, the bit cost has not sufficiently been reduced in comparison with the disk memories. It is important to increase the bit capacity of the nonvolatile semiconductor memory for solving these problems.

There are generally the following two methods for increase the bit capacity of a nonvolatile semiconductor memory. The first method is to use a method of using a finer design rule in VLSI technology for miniaturization or scaling with the advanced circuit system of the memory cell and device structure so as to reduce a chip size occupied by the memory cell array and peripheral circuits. The second method is to use a method of making multilevel memory cells and making a single memory transistor store a plurality of bits to raise the storage capacity with the same bit capacity.

In the former method, miniaturization is carried out by the so-called scaling rule, but various inherent problems exist concerning the scaling in order to realize a large capacity nonvolatile semiconductor memory of 1 Gb or more by a plenarily contiguous floating gate (FG) type flash memory. In particular, the problems that reduction of an operating voltage becomes difficult due to the fact that the thickness of the tunnel oxide film is not scaled have been pointed out (refer to Nikkei Microdevices, January and February 1997).

Namely, in an FG type flash memory, the charges in the floating gate are held mainly by the thickness of the tunnel oxide film. Therefore, according to theoretical analysis of a back tunneling current from the floating gate, the thickness of the tunnel oxide film is physically limited to about 6 nm. However, at present, before this physical limit, there have been severe limit of thickness of tunnel oxide film due to the stress induced leakage current (SILC) in FG type flash memory. In the current FG type, it is pointed out, a high electric field of about 10 to 12 MV/cm is used for writing of data. Therefore stress induced leakage current (SILC) of the tunnel oxide film is increased along with the increase after the endurance W/E cycles number of times, and this determines the effective limit of thickness of the tunnel oxide film. Due to the limitation on the film thickness due to the increase of the stress induced leakage current, it is difficult to reduce the thickness of the tunnel oxide film to as low as the a theoretical limit of 6 nm. The practical limit of the thickness of the tunnel oxide film has therefore been considered to be 8 nm. For low voltage writing operation, the tunnel oxide film must be made thin, but the limit of reduction of thickness of the tunnel oxide film contradicts with the scaling rule for lowering the operating voltage and therefore the scaling of the operating voltage has become difficult. As a result, the reduction of the area of the peripheral circuits etc. has become very difficult.

On the other hand, in a metal (generally conductive gate)-nitride-oxide semiconductor (MNOS) type nonvolatile semiconductor memory, carrier traps in a nitride film $Si_xN_y$ (0<x<1, 0<y<1) mainly responsible for holding the charges or at an interface between a top oxide film and the nitride film spreads dispersedly in the direction of film thickness or the planar direction, so the data retention characteristic depends upon an energy-like and spatial distribution of the charge captured by the carrier traps in the $Si_xN_y$ film in addition to the thickness of the tunnel oxide film. Where a leakage current path is locally generated in this tunnel oxide film, in the FG type, lots of charges leak by passing through the leakage path, while in the MONOS type, the local charges in the vicinity of the leakage path merely locally leak by passing through the leakage path.

For this reason, the problem of the reduction of thickness of the tunnel oxide film in MONOS is not as serious as in the FG type, and a scaling property of the tunnel oxide film in a miniaturized MONOS type memory transistor having an extremely short gate length is better than that of the FG type.

In order to implement a large scale nonvolatile semiconductor memory by reducing the cost per bit and increasing the bit capacity of such a MONOS type or MNOS type nonvolatile memory, it is essential to utilize a single-transistor type memory cell structure.

In a conventional MONOS type nonvolatile memory, however, the mainstream is the two-transistor type in which a selection transistor is connected to the memory transistor. Establishment of a memory cell technology for utilizing a single-transistor memory cell has been long been a goal. For establishment of this single-transistor memory cell technology, it is important not only to optimize the device structure, mainly the gate insulating film containing the charge storing means, and improve the reliability, but also to improve the disturb characteristic.

For a MONOS type single transistor memory cell, a technique for avoiding a read disturb is described in for example Japanese National Patent Publication (Tokuhyo) No. 8-507411.

According to the details described in this publication, a read disturb is caused due to the weak write field applied to an ONO film. Therefore the source of the selected memory transistor is biased up to the gate read voltage to set the same voltage between the source and the gate and thereby avoid a read disturb. Further, the threshold voltage at the time of erase operation is set to a negative value. In this case, the thickness of the tunnel insulating film is set to 1.6 nm as typical value.

However, in the technique described in the above publication, the following problems exist.

(1) Since the thickness of the tunnel insulating film is typically relatively thin (1.6 nm), the amount of shift of the threshold voltage in a depletion direction due to the injection of holes at the time of erase operation becomes large. For this reason, at the endurance operation, traps are formed in the tunnel insulating film due to the injection and extraction of the holes and, as a result, the endurance characteristic is deteriorated.

(2) It is difficult to scale the drain read voltage (applied voltage $V_{cc}$) corresponding to the scaling of the memory cell.

For example, in order to increase the threshold voltage −2V in the erased state to about 0.5V after source bias, a bias voltage Vr of the source and gate of about 2V becomes necessary. Accordingly, the drain read voltage supplied to the drain in this case must be about 3V at the lowest. Scaling of this drain read voltage is difficult since even if the memory transistor is miniaturized, the source bias voltage Vr does not change much at all. In actuality, in the above publication, the typical value of the drain read voltage (power supply voltage $V_{cc}$) is described as 3V to 6V.

(3) In the publication, writing of a non-selected transistor connected to the selected word line can be inhibited by setting the source and drain at the supply voltage $V_{cc}$. For this reason, in a shorter gate length region (particularly in the case of a gate length of 0.2 μm or less), erroneous writing or erroneous erasing of memory cell in a non-selected column connected to a non-selected word line cannot be inhibited unless the non-selected word line is set to a positive voltage of a certain high extent. However, among memory cells connected to a non-selected word line, in a memory cell to which a source line and a bit line of the selected memory cell are commonly connected (memory cell of non-selected row in selected column), the voltage of the source and drain is determined according to the write condition of the selected memory cell, so cannot be freely raised. As a result, this memory cell of the non-selected row in the selected column exhibits a weak written bias stress and, in addition, the thickness of the tunnel insulating film is a relatively thin 1.6 nm as a typical value, therefore a write disturb cannot be avoided.

In order to realize a MONOS type single-transistor memory cell, irrespective of the fact that a desired disturb characteristic must be guaranteed after a large number of endurance cycles, the publication has no description on the disturb characteristic after the endurance cycles.

Therefore, the present inventors performed various studies for investigating the factors determining the read disturb margin of a nonvolatile semiconductor memory device in which the charge storage layer is planarly dispersed, as represented by the MONOS type, and performed the endurance of the MONOS memory transistor by using an NOR type memory cell a large number of times to determine the problems relating to the deterioration of the read disturb characteristic.

As a result, it became clear that there are two problems in the read gate voltage dependency of the read disturb characteristic after $10^6$ endurance cycles. Note that, the voltage supplied to the selected word line and selected bit line at this time was 1.5V, and the voltage of a non-selected word line, non-selected bit line, and all source lines was set to be 0V.

As a first problem, it was verified that the selected memory transistor or non-selected memory transistors of the same row with gates connected to the selected word line to which a voltage (1.5V) is supplied is indispensable to be written weakly as the reading time increases. As a result, the gate threshold voltage in the erased state increased along with the elapse of time and the difference of the gate threshold voltage ($V_{th}$ window width) between the written state and erased state after 10 years did not become sufficient.

Further, as a second problem, it was verified that, by lowering the $V_{th}$ in the erased state by a deep erase operation to the depletion direction by for example the injection of holes and increasing the $V_{th}$ window width of the memory transistor at the time of erasing and by a roll-off of the gate threshold voltage due to a short channel effect, the $V_{th}$ window shifts relatively to a negative side of the threshold voltage when the gate length becomes shorter, and the gate threshold voltage in the written state became smaller than the voltage of the selected word line (read gate voltage) when the reading is carried out for 10 years. As a result, when reading the data in the written state, a current flows between the bit line and the source line similar to the time of reading the erased state, therefore single-transistor memory cell operation becomes difficult. Further, where the gate threshold voltage in the erased state of the non-selected transistor is too low, the transistor becomes depleted, the problem of a flow of leakage current at the time of reading occurs even if the gate voltage is 0V, and single-transistor memory cell operation becomes difficult.

These phenomena are thought to be inherent even in the usual FG type, but in the FG type, the thickness of the tunnel oxide film is 8 nm or more. Therefore even when the selected word line voltage at the time of reading is a high 3.3V, there is no problem of "soft write". Further, in the FG type, the gate threshold voltage $V_{th}$ in the erased state can be set high in comparison with the MONOS type. The two above describing problems are problems manifested in the case of a single-transistor memory cell in which the gate length is miniaturized in a memory element of MONOS type or the like in which the reduction of thickness of the tunnel insulating film is possible in comparison with the FG type and the charge storing means is made planarly dispersed.

SUMMARY OF THE INVENTION

The present invention was made in consideration with such an actual circumstance and has as its object to newly propose, as one link of the studies for facilitating the realization of a single-transistor type memory cell in a nonvolatile semiconductor memory device having a charge storing means inside a gate insulating film, particularly which basically operates by injecting charges into a planarly dispersed carrier traps or making it be rejected them from the traps, a bias setting procedure capable of improving the read disturb characteristic without causing deterioration of a read and program speed and data retention characteristic, conditions of the tunnel insulating film, and conditions of the threshold value in the erased state and provide a nonvolatile semiconductor memory device having a configuration suitable for their execution.

In order to solve the first problem which became clear as the result of the above studies, a method of reading a nonvolatile semiconductor memory device of the present invention comprises a method of reading a nonvolatile semiconductor memory device provided in a matrix form with a plurality of memory transistors each having a substrate, a semiconductor channel forming region provided on the surface of that substrate, a source region in contact with that channel forming region, a drain region in contact with the channel forming region at a distance from the source region, a gate insulating film containing a tunnel insulating film provided on the channel forming region, a conductive gate electrode provided on the gate insulating film, and a charge storing means provided inside the gate insulating film, comprising supplying a non-selected bias voltage having a voltage value between a source voltage at the time of reading the selected memory transistor and a voltage supplied to the gate of the selected memory transistor at the time of reading to the sources and/or drains of the non-selected column memory transistors arranged in columns not containing the selected memory transistor for reading the information at the time of reading and thereby inhibiting erroneous reading to non-selected column memory transistors.

Further, preferably, by supplying a voltage (selected source line bias voltage) to the source of the selected memory transistor as well, erroneous reading of the selected memory transistor is suppressed.

Further, preferably, the thickness of the tunnel insulating film is made relatively thicker and is set to 2.3 nm or more.

Further, preferably, at the time of reading, a voltage (non-selected word line bias voltage) almost the same as or lower than the bias voltage at the time of setting the source voltage is supplied to gates of non-selected row memory transistors arranged in rows not containing the selected memory transistor.

The method of reading a nonvolatile semiconductor memory device of the present invention is preferred for a nonvolatile semiconductor memory device in which the charge storing means is made planarly dispersed (for example, a MONOS type, MNOS type, and nanocrystal type) and is preferred for a NOR type in the memory cell system. Further, from the viewpoint of reduction of the memory cell area, either of a layout in which one of the source line and the bit line is laid serpentine while avoiding self-aligned contact for achieving connection with the other on an element isolation region and a layout in which source lines and/or bit lines are formed in layers is desirable.

The method of reading of the present invention is further preferred for the following two cases from the results of the above studies and this background:

(1) The voltage supplied to sources and/or drains of the non-selected column memory transistors preferably has an absolute value of the difference with the voltage supplied to the gate of the selected memory transistor at the time of reading of 1V or less.

(2) The non-selected memory transistors of a short gate length connected to the selected bit line have a distribution of impurity concentration of the channel forming regions not causing punch through when voltage is supplied to the selected bit line at the time of reading of the memory cell.

In such a method of reading of the present invention, by supplying voltage to sources and/or drains of the non-selected column memory transistors at the time of reading, the effective electric field applied to the tunnel insulating film interposed with for example the charge storing means can be eased. As a result, so-called "soft write", that is, the increase of the threshold voltage of the non-selected column memory transistors in the erased state along with the elapse of time, is effectively prevented, and the read disturb characteristic is improved.

It is possible to make the read gate voltage (selected word line voltage) higher within a range where this read disturb characteristic does not pose a problem. The memory cell current at the time of reading is increased by that amount. In this case, the read gate voltage becomes higher than the read drain voltage.

Further, in comparison with the above publication, the tunnel insulating film is set relatively thick, therefore, the tunnel probability is reduced in both of the selected memory cell and the non-selected memory cells and therefore the read disturb characteristic is improved.

On the other hand, in order to solve the second problem which became clear as a result of the above studies and in order to solve the problem possessed by the technology disclosed in the above publication, the method of reading a nonvolatile semiconductor memory device of the present invention supplies a voltage between the voltage supplied to the gate of the selected memory transistor at the time of reading and a ground voltage to the source of the selected memory transistor for reading of information at the time of reading.

This voltage supplied to the selected source line etc. will reversely bias the source region with respect to for example the channel forming region and has both of an effect of improving the read disturb characteristic of the selected memory transistor and an action of shifting the threshold voltage in the erased state to a positive direction. The threshold voltage shifts to the positive direction by the application of the source bias voltage. Therefore the leakage current from the non-selected memory cells connected to the selected source line/bit line is suppressed as the source bias voltage value is made larger.

This method of reading is derived from the discovery of the fact in the above studies that by just increasing the source voltage of the selected memory transistor somewhat, the gate threshold voltage increases by a large extent more than the increase in that voltage. When the source voltage is increased too much, the voltage supplied between the source and the drain of the selected memory transistor becomes insufficient due to the relationship with the read drain voltage supplied to the bit line. In this method of reading, there is the action that the gate threshold voltage can be largely increased without greatly sacrificing the value of the voltage supplied between the source and the drain, whereby the problem of the downward shift of the $V_{th}$ window width due to deep erase effect and the roll-off effect, which became clear by the studies, can be improved.

Further, the scaling of the drain read voltage, which had been difficult with the technology disclosed in the above publication, becomes easy.

Further, in the case of page reading for selecting a group of memory cells connected to the same word line and reading them in parallel, since the memory cells connected to the selected word line are all treated as selected memory cells, the method of solving the problems for the above selected memory cell can be applied. For this reason, a single-transistor memory cell capable of performing page reading can be realized.

In the application of voltage to the source of the selected memory transistor and to the sources and drains of the non-selected column memory transistors of the selected row by the former method, in order to optimize the bias setting of remaining memory transistors of the non-selected rows, desirably a voltage substantially the same as or lower than that of the source of the selected memory transistor is supplied to the gates of the related non-selected row memory transistors.

In the NOR type, the same voltage is also supplied to the sources of the memory transistors of the non-selected rows together with the application of voltage to the source of the related selected memory transistor. Further, voltage is supplied to the sources and drains of all of the non-selected column memory transistors. The same is true for the memory transistors of the non-selected rows to which the read gate voltage is not supplied. In this way, the memory transistors of the non-selected rows in the NOR type are not covered by the improvement of the read disturb characteristic taken up in the present invention, but voltage is supplied to the sources (or sources and drains) thereof by the setting of the bias voltage of the present invention.

Voltage is supplied to the gates of the non-selected rows so as to ease the effect of the setting of the bias voltage in the present invention.

Note that, in the FG type, there is no known technology for supplying a bias voltage to the non-selected source lines, non-selected bit lines, and non-selected word lines with the intention of improving the disturb characteristic of the non-selected memory cells at the time of reading data. This is because, in the FG type, the thickness of the tunnel oxide film is about 8 nm or more and therefore the non-selected memory cells connected to the selected word line in the erased state are not susceptible to soft write with a read gate voltage of about 3.3V.

On the other hand, the nonvolatile semiconductor memory device of the present invention is characterized in that provision is made of a selected memory transistor biasing means and/or a non-selected column biasing means as the means for working the above method of reading.

The selected memory transistor biasing means supplies a voltage located between the voltage supplied to the gate of a selected memory transistor at the time of reading and the ground voltage to the source of the selected memory transistor for reading the information. The non-selected column biasing means supplies a voltage having a value between the source voltage at the time of reading of the selected memory transistor and the voltage supplied to the gate of the selected memory transistor at the time of reading to the sources and/or drains of the non-selected column memory transistors arranged in columns not containing the selected memory transistor.

Preferably, provision is further made of a non-selected row biasing means for supplying a voltage substantially the same as or lower than the source voltage of the selected memory transistor to gates of the non-selected row memory transistors.

The nonvolatile semiconductor memory device of the present invention is a nonvolatile semiconductor memory device provided in a matrix form with a plurality of memory elements each having a substrate, a semiconductor channel forming region provided on the surface of that substrate, a source region in contact with that channel forming region, a drain region in contact with the channel forming region at a distance from that source region, a gate insulating film containing a tunnel insulating film provided on the channel forming region, a conductive gate electrode provided on that gate insulating film, and a charge storing means provided inside the gate insulating film, wherein gate electrodes of the plurality of memory elements are connected to a plurality of word lines, source regions or drain regions are connected to a common line in the bit line direction electrically insulted from each of the plurality of word lines and intersecting the word lines, and further provision is made of a non-selected column biasing means for supplying to source regions and/or drain regions of the non-selected memory elements having gate electrodes connected to the selected word line at the time of reading via the common line a voltage by which the related regions become reversely biased with respect to the channel forming region.

Also, preferably, the device further has a selected element biasing means for supplying to the common line connected to the source region of the memory element selected at the time of reading a voltage of a polarity becoming an reverse bias to the channel forming region of the memory element.

Further, preferably, the device further has a non-selected row biasing means for supplying to the non-selected word lines a voltage which reversely biases the channel forming region and is substantially the same as or lower than the voltage supplied to the selected element biasing means at the time of reading.

BRIEF DESCRIPTION OF THE DRAWINGS

The above and other objects and features of the present invention will become more clearly by the following description with reference to the accompanying drawings, in which.

DESCRIPTION OF THE PREFERRED EMBODIMENTS

Figure 1:
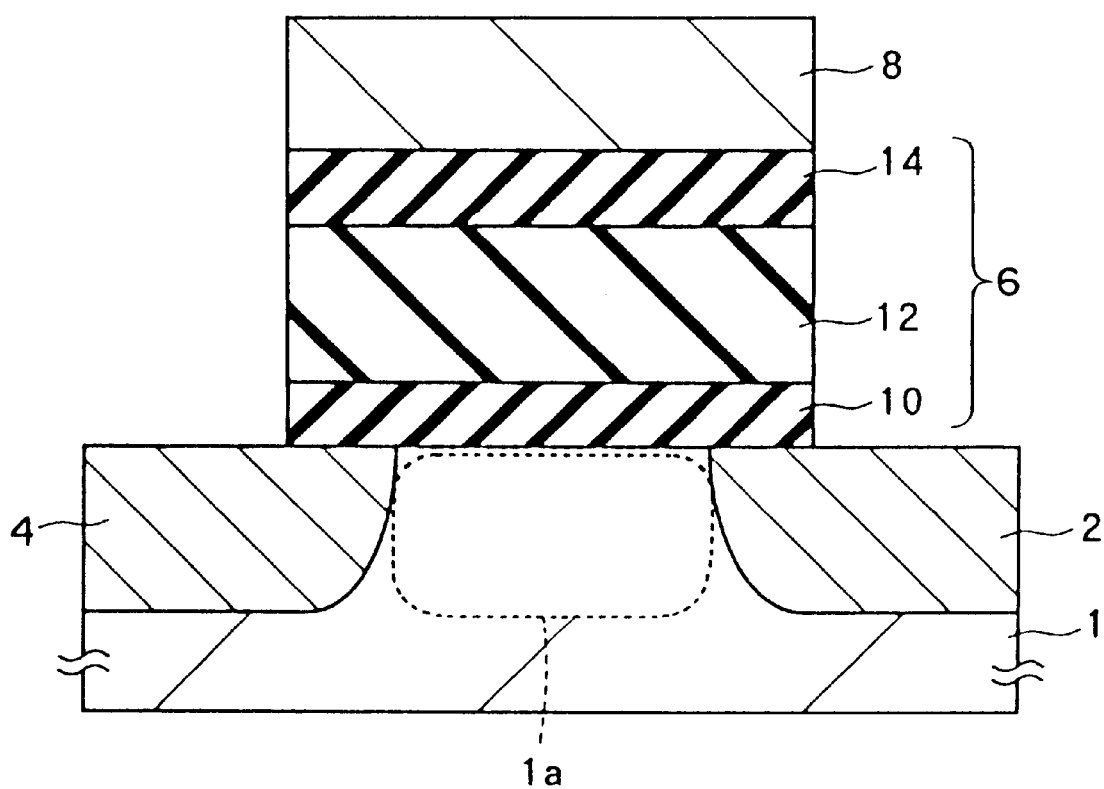
FIG. 1 it a sectional view of an element structure of a MONOS type memory transistor according to a first embodiment of the present invention.

Below, preferred embodiments of the nonvolatile semiconductor memory device according to the present invention and the method of reading the same will be explained in detail by referring to the drawings. Before this, however, since the results of the studies revealing the problems in the read disturb characteristic previously described form the premise of the present invention, the results of the studies will be explained. Next, embodiments of the present invention will be explained in detail while attesting to the efficacy of the present invention by indicating various characteristics of the nonvolatile memory after application of the present invention.

Studies Concerning Read Disturb Before Present Invention

In a MONOS type nonvolatile memory, as previously mentioned, in order to utilize single-transistor memory cell, the read disturb characteristic, particularly the read disturb characteristic after endurance W/E cycles, is important.

Further, at this time, desirably a particular memory cell structure such as a NOR type and NAND type is assumed for confirming the memory cell operation, and relationships with disturb characteristics under bias conditions different for every memory cell structure, particularly the number of endurance cycles and the read disturb characteristic, are clarified.

The read disturb characteristic is improved more when the thickness of the tunnel insulating film is thicker, but if the thickness of the tunnel insulating film is made too thick, the speed of the write/erase operation becomes slower and the operating voltage become increased. Here, the read disturb characteristic of a MONOS type nonvolatile memory transistor in which the tunnel insulating film was made relatively thick was evaluated.

Figure 24:
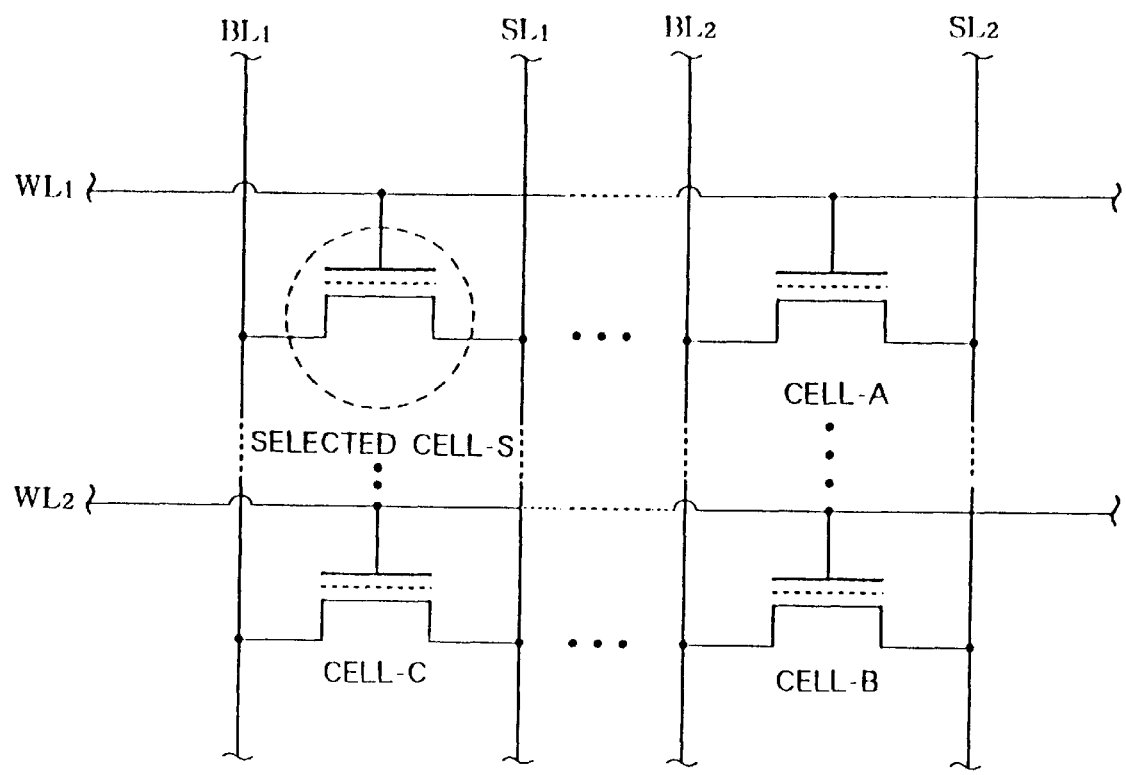
FIG. 24 is a circuit diagram of a memory cell arrangement of a separated source NOR type at the time of an investigation before the present invention, and FIG. 25 a view of the read disturb characteristic after $10^6$ endurance W/E cycles for a memory transistor in a non-selected memory cell A relating to the problem which becomes clear in the studies before the present invention.

FIG. 24 shows the memory cell arrangement of a NOR type with separated source line used at the time of the study. Here, a non-selected memory cell connected to a selected word line WL1 was designated as cell A, a non-selected memory cell connected to a non-selected word line WL2 and connected to a selected source line SL1 and selected bit line BL1 the same as those for a selected memory cell S was designated as cell C, and a non-selected memory cell connected to the non-selected word line WL2 and connected to a non-selected source line SL2 and a non-selected bit line BL2 was designated as cell B. Further, the number of word lines in one string was 100.

In the NOR type memory cell, at the time of a read operation of the MONOS type memory transistor, usually, in a state where all of the selected source line SL1 and non-selected source line SL2, non-selected bit line BL2, and non-selected word line WL2 are brought to the ground voltage 0V and the predetermined read drain voltage (for example, 1.5V) is supplied to the selected bit line BL1, the predetermined read gate voltage (for example, 1.5V) is supplied to the selected word line WL1. At this time, the voltage of 1.5V is supplied between the source and drain in only the selected memory cell S and the voltage of 1.5V is supplied to the gate. Therefore when the related memory cell data is for example "0", the gate threshold voltage thereof is lower than the read gate voltage, therefore the memory transistor becomes on and the read current flows from the bit line BL1 to the selected source line SL1. When the related memory cell data is for example "1", the gate threshold voltage thereof is higher than the read gate voltage. Therefore the memory transistor remains off as it is, and the read current does not flow. On the other hand, the read gate voltage is supplied to the selected word line WL1, therefore the selected memory cell S and the non-selected memory cell A receive disturb due to the soft write. Therefore, for the realization of such a single-transistor type memory cell, it becomes important how the disturb at the time of reading of the selected memory cell S and non-selected memory cell A is suppressed. Namely, for memory transistors of the selected memory cell S and the non-selected memory cell A in the erased state, there is the problem of increased gate threshold voltage due to a weak injection of electrons from the channel forming region side into the trap in the ONO film.

The most conspicuous increase of this gate threshold voltage occurs after endurance cycles is frequently carried out. Therefore, the number of endurance W/E cycles up to a standard device reliability life was assumed to be more than $10^4$, and the read disturb characteristic after endurance cycles was measured.

FIG. 25 shows the read disturb characteristic after $10^6$ endurance W/E cycles for the memory transistor (gate length: 0.2 μm) in the non-selected memory cell A. In this characteristic evaluation, in order to change the electric field stress of ONO film, the gate voltage Vg (voltage supplied to the selected word line WL1) was used as a parameter.

Detection sensitivity depend on the sensitivity of the sense amplifier. In general, in order to secure read the data while maintaining a sufficiently high speed property, threshold voltage window, a difference of the gate threshold voltage between the erased state and written state (hereinafter referred to as a $V_{th}$ window width) must be more than 0.5V even at the lowest. Data retention characteristics is shown in FIG. 25. In the present characteristic evaluation, experimental data of up to approximately $1\times10^4$ seconds are taken, then the data is extrapolated by a straight line up to $3.1\times10^8$ seconds, that is, 10 years, and the $V_{th}$ window width at this time was estimated. In the read disturb characteristic or data retention characteristic in a time region longer than a certain constant time (for example $1\times10^4$ seconds), the fact that the time dependency of the $V_{th}$ shift decrease linearly after a certain long time region is supported by Landquist's theory.

As a result, it was found that there are the following two problems in setting this bias voltage.

As the first problem, it was clarified that, in the non-selected memory cell A connected to the selected word line WiL to which the gate voltage Vg (1.5V) was supplied, the gate threshold voltage $V_{th}(E)$ on the erasing side was increased along with the elapse of time, while the gate threshold voltage window become gradually narrower and, as a result, the $V_{th}$ window width after 10 years became the value of 0.5V or less. This is because, during endurance cycles, carrier traps are generated in the tunnel insulating film and a back tunnel current flows via these carrier traps.

Further, as a second problem, for the selected or memory cell S, it was found that both of the gate threshold voltage $V_{th}(W)$ on the written state and the gate threshold voltage $V_{th}(E)$ on the erased state defining the $V_{th}$ window value shift, particularly, that the gate threshold voltage $V_{th}(W)$ on the written state became smaller than the voltage (read drain voltage) supplied to the selected bit line BL1. Further, when the $V_{th}$ in the erased state shifts to the deeply erased direction, the leakage current in the non-selected memory cell C is increased and becomes a problem. These problems were made clear when the gate length of the memory transistor was shorter than 0.18 μm. As a result, when reading the data in the write state of the selected memory transistor, in the same way as the reading of the erased state, a current flows through the bit line. Further, a leakage current flows in the non-selected memory cell in the erase state.

If the margin of the difference of an amount of current between the selected memory cell and a non-selected memory cell in the erased state or the difference of the amount of current between the write state and the erase state in the selected memory cell is sufficient, discrimination of the data is possible. But there is the problem that replacement by a single-transistor memory cell is not possible as is due to the above phenomena or that the enhancement operation region is narrow and achievement of multivalues is difficult. Note that, the cause of the reduction of the gate threshold voltage is that the $V_{th}$ in the erased state must be lowered from the viewpoint of deep erase operation or that roll-off of the gate threshold voltage occurs by the short channel effect of the memory transistor.

It can be considered that these problems similarly exist when realizing a NOR type single-transistor memory cell in not only a MONOS type in the present study, but also other nonvolatile memories in which the charge storing means mentioned later is planarly dispersed.

Further, it can be considered that these phenomena are inherent also in a usual FG type, but in an FG type, the thickness of the tunnel oxide film is 8 nm or more and therefore the problem of a soft write does not occur even in a case where the selected word line voltage at the time of reading is as high as 3.3V. Further, in the FG type, the gate threshold voltage $V_{th}$ in the erased state can be set high in comparison with the MONOS type. The two problems are problems manifested in the memory element of a MONOS type etc. in which the reduction of thickness of the tunnel oxide film is possible in comparison with the FG type and the charge storing means is made planarly dispersed.

In the method of reading a nonvolatile semiconductor memory device according to the present embodiment, first, as a measure for solving the second problem, the data was read by reversely biasing the source line SL1 of the selected memory cell S with respect to the channel forming region mentioned later, that is, in a polarity where a pn junction between the source region and the channel forming region of the selected memory cell S becomes reversely biased.

In general, the gate threshold voltage relatively shifts in the positive direction by use of the source bias. In the present study, it was found that the amount of shift of this gate threshold voltage largely changed exceeding the amount of bias of the source voltage. As a result, it was seen that increasing the source voltage was effective for making the gate threshold voltage of the related transistor large without much sacrifice to the voltage supplied between the source and drain of the selected memory transistor.

The present method of reading reduces the decrease of the gate threshold voltage in the erased state by optimizing this source bias voltage. In this case, the bias voltage between the gate read voltage and the ground voltage is supplied to the source.

Next, as a measure with respect to the first problem, in the present embodiment, the effective electric field applied to the tunnel insulating film of the non-selected memory cell A was reduced. For example, a positive bias voltage was supplied to the non-selected source line SL2 and the non-selected bit line BL2 connected to the related non-selected memory cell A. This positive bias voltage is the voltage of a direction becoming a reverse bias to the channel forming region mentioned later, that is. the pn junction between the source region or drain region and the channel forming region of the non-selected memory cell becomes reversely biased. The value thereof is desirably between the source application voltage and the gate application voltage of the selected memory cell S as will be mentioned later. Particularly, it is further preferred if the voltage difference between the gate and source or drain is set at not more than 1V.

Further, where a positive bias voltage is supplied to the non-selected source line SL2 and the non-selected bit line BL2, there is a possibility that the disturb in the written state of the non-selected memory cell B will become a problem. In this case, it can be reduced by supplying a positive bias voltage to the non-selected word line WL2. The voltage supplied to this non-selected word line WL2 is a voltage of a polarity becoming a reverse bias to the channel forming region mentioned later. The value thereof is set, as will be mentioned later, to be substantially the same as or lower than the source application voltage of the selected memory cell S and is desirably set to a bias voltage of an extent where the leakage current from the non-selected memory cell C can be sufficiently suppressed.

Note that, the source bias voltage of the selected memory cell S meant for solving the second problem has the effect of improving the disturb characteristic of the selected memory cell S. The effect thereof was confirmed.

As a concrete means for achieving such a method of reading, in the nonvolatile semiconductor memory device of the present invention, provision is made of a selected memory transistor biasing means (or also referred to as a selected element biasing means), a non-selected column biasing means, and a non-selected row biasing means.

Further, it Is also possible to apply the present invention to an FG type nonvolatile memory device. As a particularly preferred nonvolatile memory device, there is one having a memory transistor in which the charge storing means is made planarly dispersed. Here, the term "charge storing means means a charge holding medium which is formed in the gate insulating film, transfers a charge with the substrate side in accordance with the voltage supplied to the gate electrode on the gate insulating film, and holds a charge. Further, the term "planarly dispersed charge storing means" means a carrier traps of ONO (oxide-nitride-oxlde) film or NO (nitride-oxide) film or other nitride film bulk or a deep carrier traps formed near the interface of an oxide film and a nitride film, a nanocrystal composed of silicon, germanium, metal or the like and having a particle size on the nanometer (nm) order, a finely divided floating gate comprised of polycrystalline silicon etc. and divided into fine dots, etc.

When the memory element has multilevel information, the read disturb becomes severe, therefore the present invention is particularly preferred for this.

Further, as the region in which the memory transistor is formed (element forming region) in the present invention, there are various forms. For example, other than the semiconductor substrate per se, a well formed on the surface side in the substrate, an epitaxial growth layer formed on the surface of the semiconductor substrate, a semiconductor layer having an SOI (silicon on insulator) type insulation structure, or the like corresponds to the element forming region. The term channel forming region" in the present invention means a region inside the surface side of which is formed a channel through which electrons or positive holes may pass.

Next, preferred embodiments of the present invention will be further concretely explained.

First Embodiment

The present embodiment is for a MONOS type nonvolatile memory in which the film (gate insulating film) between the gate electrode and the channel forming region is made an ONO film.

Figure 2:
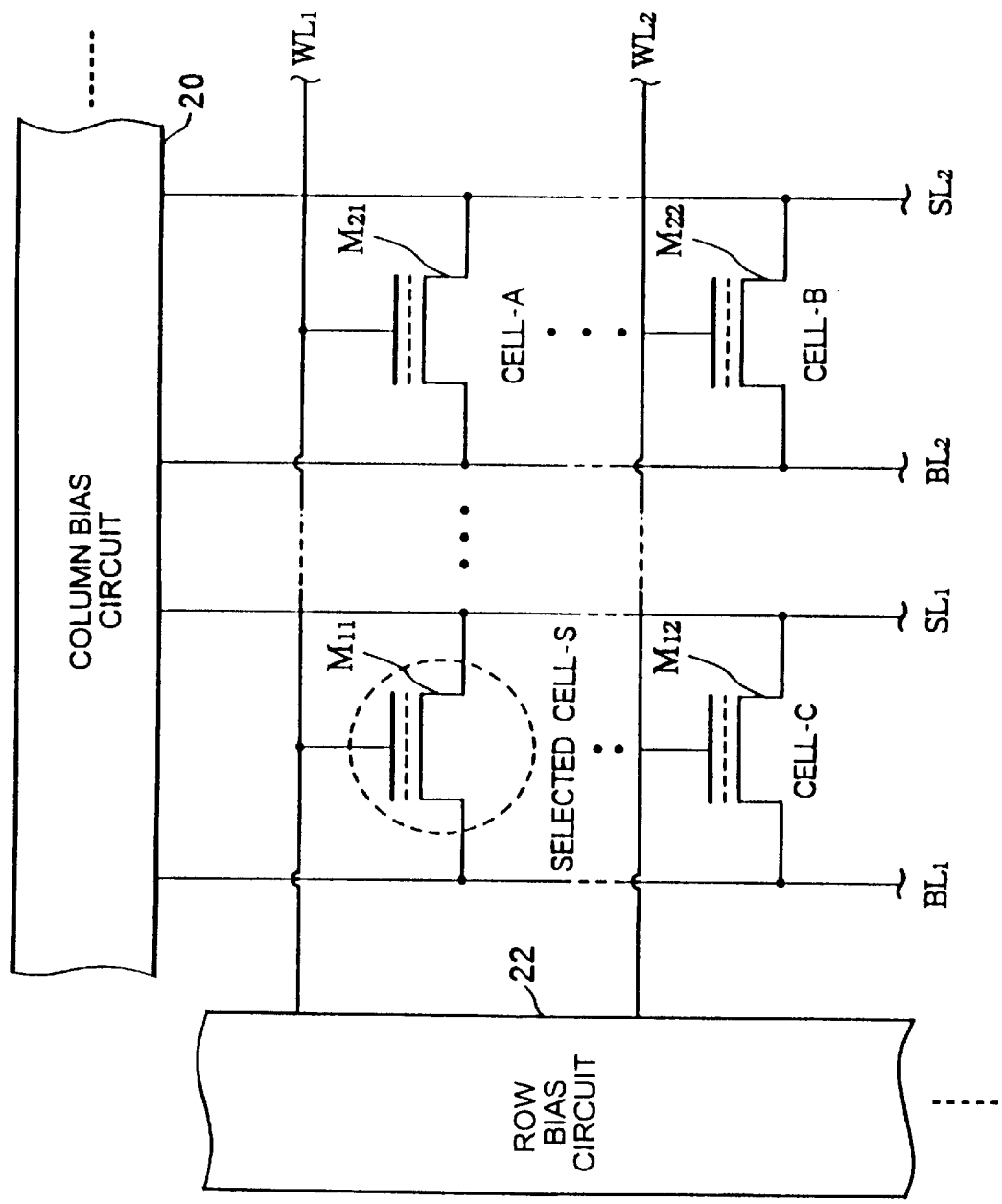
FIG. 2 is a circuit diagram of a principal configuration of a nonvolatile memory device common to first to fourth embodiments of the present invention.

FIG. 1 is a sectional view of the element structure of this MONOS type memory transistor; and FIG. 2 is a circuit diagram of the configuration of the principal parts of the MONOS type nonvolatile memory device of the present invention.

In the figure, reference numeral 1 denotes a semiconductor substrate such as a silicon wafer having an n-type or a p-type conductivity type, 1a a channel forming region, and 2 and 4 the source region and the drain region of the related memory transistor. The channel forming region of the present example corresponds to the part sandwiched between the source region 2 and the drain region 4 in the substrate 1 as the element forming region. Further, the source region 2 and the drain region 4 are regions having a high conductivity formed by introducing a impurity having an reverse conductivity type to that of the channel forming region 1a into the semiconductor substrate 1 with a high concentration and come in a variety of forms. Usually, a low concentration impurity region referred to as an LDD (lightly doped drain) is frequently provided at the position of the substrate surface where the source region 2 and the drain region 4 approach the channel forming region 1a.

On the channel forming region 1a, a gate electrode 8 of the memory transistor is stacked via the gate insulating film 6. The gate electrode 8 is generally made of a film of polycrystalline silicon into which a p-type or n-type impurity is introduced with a high concentration (doped poly-Si) or doped poly-Si and a high melting point metal silicide.

The gate insulating film 6 in the present embodiment is constituted by, in order from the lowest layer, a tunnel insulating film 10, a nitride film 12, and a top oxide film 14.

The tunnel insulating film 10 is made of for example a nitrided-oxide film obtained by thermally nitridizing silicon oxide ($SiO_2$) formed by thermal oxidation. Electrons are conducted in this insulating film by direct tunneling. Further, in the MONOS type, a triangular potential formed by the tunnel insulating film 10 and part of the nitride film 12 becomes the region in which electrons are effectively tunneled. Electrons are conducted in this by utilizing modified FN (Fowler-Nordheim) tunneling. The thickness of the tunnel insulating film 10 can be set within a range from 2.0 nm to 3.6 nm according to the purpose of use. Here, it is set at 2.8 nm.

The nitride film 12 is constituted by for example silicon nitride ($Si_xN_y$, $0<x<1$, $0<y<1$) of for example 5.0 nm.

The top oxide film 14 must form a deep carrier trap with a high density near the interface with the nitride film 12. For this purpose, it is formed by thermally oxidizing the nitride film after forming the film. The thickness of the top oxide film 14 must be 3.0 nm even at the lowest, preferably 3.5 nm or more, in order to effectively prevent the injection of holes from the gate electrode 8 and thereby prevent reduction of the number of times which data can be rewritten.

Next, an example of a method for manufacturing a memory transistor having such a structure will be simply explained focusing on the gate insulating film step.

First, explaining the rough flow of the basic manufacturing method, after performing the formation of an element isolation region, ion implantation for adjusting the gate threshold voltage $V_{th}$, etc. on the prepared semiconductor substrate (for example, a p-type silicon wafer) 1 according to need, the gate electrode 8 is formed on an active region of the semiconductor substrate 1 via the gate insulating film 6, source and drain regions 2 and 4 are formed in self-aligned with this, an inter-layer insulating film is formed and contact holes are formed, the source and drain electrodes are formed, and, in accordance with need, upper layer interconnections are formed via the inter-layer insulation layer, and overcoat is formed, pad windows are opened, etc. so as to complete the related nonvolatile memory transistor.

In the step for formation of the gate insulating film 6, first the silicon substrate 1 is thermally oxidized by a high temperature rapid thermal oxidation method (RTO method) in a stream of oxigen, next a high temperature rapid thermal nitridization treatment (RTN treatment) is carried out with respect to the tunnel insulating film 10 in an ammonia atmosphere under conditions of for example a furnace temperature of 1000° C. and a treatment time of one minute thereby to form the tunnel insulating film 10 (final thickness: 2.8 nm).

Next, the nitride film 12 is deposited thicker than 5.0 nm by a low pressure CVD process so that the final film thickness becomes 5.0 nm. This CVD is carried out by using an introduction gas obtained by mixing for example dichlorosilane (DCS) and ammonia and at a substrate temperature of 650° C. In the formation of the silicon nitride film on this thermally oxidized film, according to need, preferably pretreatment (wafer pretreatment.) of the underlying surface and the film formation conditions are optimized in order to suppress an increase of roughness of the finished film surface. In this case, if the wafer pretreatment is not optimized, the surface morphology of the silicon nitride film is bad and the correct film thickness cannot be measured, therefore after sufficiently optimizing this wafer pretreatment, the film thickness is set taking into account the amount of reduction of the silicon nitride film reduced in the next thermal oxidation step.

The formed silicon nitride film surface is oxidized by the thermal oxidation process to form the top oxide film 14 (3.5 nm). This thermal oxidation is carried out in for example an $H_2O$ atmosphere at a furnace temperature of 950° C. By this, deep carrier traps having a trap level (energy difference from the conduction band of silicon nitride) of 2.0 eV or less is formed with a density of about 1 to $2 \times 10^{13} / cm^2$. Further, the thermally oxidized silicon film (top oxide film 14) is formed to 1.6 nm with respect to 1 nm of nitride film 12. The thickness of the nitride film serving as the underlying layer is reduced by this ratio, so the final thickness of the nitride film 12 becomes 5 nm.

In the nonvolatile memory of the present embodiment, as shown in FIG. 2, the memory cell of the NOR type memory cell array is constituted by one memory transistor having the above structure. In the NOR type memory cell array, memory transistors M11 to M22 are arranged in the form of a matrix. These transistors are interconnected by word lines, bit lines, and separated type source lines similar to FIG. 24 described above. Further, memory cells A to C and the memory cell S are defined in the same way as in the above FIG. 24. Note that while FIG. 2 shows four memory cells, the actual memory cell array is constituted by similar repeated arrangements and connections.

In the nonvolatile memory of the present example, a column bias circuit 20 which is connected to all bit lines and source lines and supplies a predetermined voltage to the source region 2 of the selected memory transistor M11 and the source regions 2 and/or drain regions 4 of the non-selected memory transistors and a row bias circuit 22 which is connected to all word lines and supplies a predetermined voltage to the non-selected word line WL2 are provided.

These bias circuits 20 and 22 are for greatly improving the read disturb characteristic of a non-selected memory cell A while preventing the deterioration of the disturb characteristic of particularly a non-selected memory cell B when data is read from the selected memory cell S. The column bias circuit 20 corresponds to the "selected memory transistor biasing means (or selected element biasing means)" and the "non-selected column biasing means" of the present invention. Further, the row bias circuit 22 corresponds to the "non-selected row biasing means" of the present invention.

Note that, the following explanation will be advanced on the premise that the column bias circuit 20 simultaneously gives the same voltage (non-selected column bias voltage) to both of the source region 2 and the drain region 4 of the memory transistors, but in the present invention, the non-selected column bias voltage is not limited to the same voltage. Accordingly, it is also possible to supply different voltages between the source line and the bit line. Further, it is also possible to supply the voltage to one of the source line and the bit line and make the other for example open.

In the nonvolatile memory of such a configuration, when reading the data from the selected memory cell S, the column bias circuit 20 supplies the selected source line bias voltage, for example, 0.5V, to the source line SL1 of the selected column and supplies the non-selected column bias voltage, for example, 1V, to the source line SL2 and the bit line BL2 of the non-selected column. Further, the row bias circuit 22 supplies the non-selected word line bias voltage, for example, 0.5V, to the word line WL2 of the non-selected row. Further, the read drain voltage, for example, 1.5V, is supplied to the selected bit line BL1, and a predetermined voltage, for example, 1.5V, is supplied to the selected word line WL1. By this, at the memory transistor M11 of the selected memory cell S, a voltage is supplied between the source and the drain, and the gate is set at the predetermined read gate voltage, therefore, a bias voltage is set with which the related memory transistor M11 can turn on. When the selected memory cell data is for example "0", the gate threshold voltage thereof is lower than the read gate voltage, therefore the memory transistor M11 becomes on and a read current flows from the selected bit line BL1 to the selected source line SL1. When the related memory cell data is for example "1", the gate threshold voltage thereof is higher than the read gate voltage, therefore the memory transistor remains off as is and the read current does not flow.

On the other hand, in the non-selected memory cell A, the voltage difference supplied to the gate insulating film 6 of the memory transistor M11 thereof is reduced from the 1.5V of the prior art to 0.5V. As a result, in comparison with the case where the bias voltage to the non-selected source line and the non-selected bit line is 0V, the read disturb characteristic is greatly improved.

This non-selected column bias voltage (1V) is similarly supplied to the non-selected memory cell B. Accordingly, the application per se of the non-selected column bias voltage (1V) tends to increase the voltage difference between the source and drain of the memory transistor M22 and the gate electrode. On the other hand, by the applying the non-selected word line to bias voltage by the row bias circuit 22, the gate voltage of the memory transistor M22 Is raised and as a result deterioration of the disturb characteristic of the non-selected memory cell B is effectively prevented.

Further, in the non-selected memory cell C, the source and gate voltages of the memory transistor M12 are raised substantially linked with each other, therefore the deterioration of the disturb characteristic thereof is effectively prevented.

Below, the effect of the present invention will be attested to by showing various characteristics of the nonvolatile memory after application of the present invention.

Source Bias Voltage Dependency of Gate Threshold Voltage

First, the effect of application of the selected source line bias voltage to the source of the selected memory transistor M11 by the column bias circuit 20 will be explained.

Figure 3:
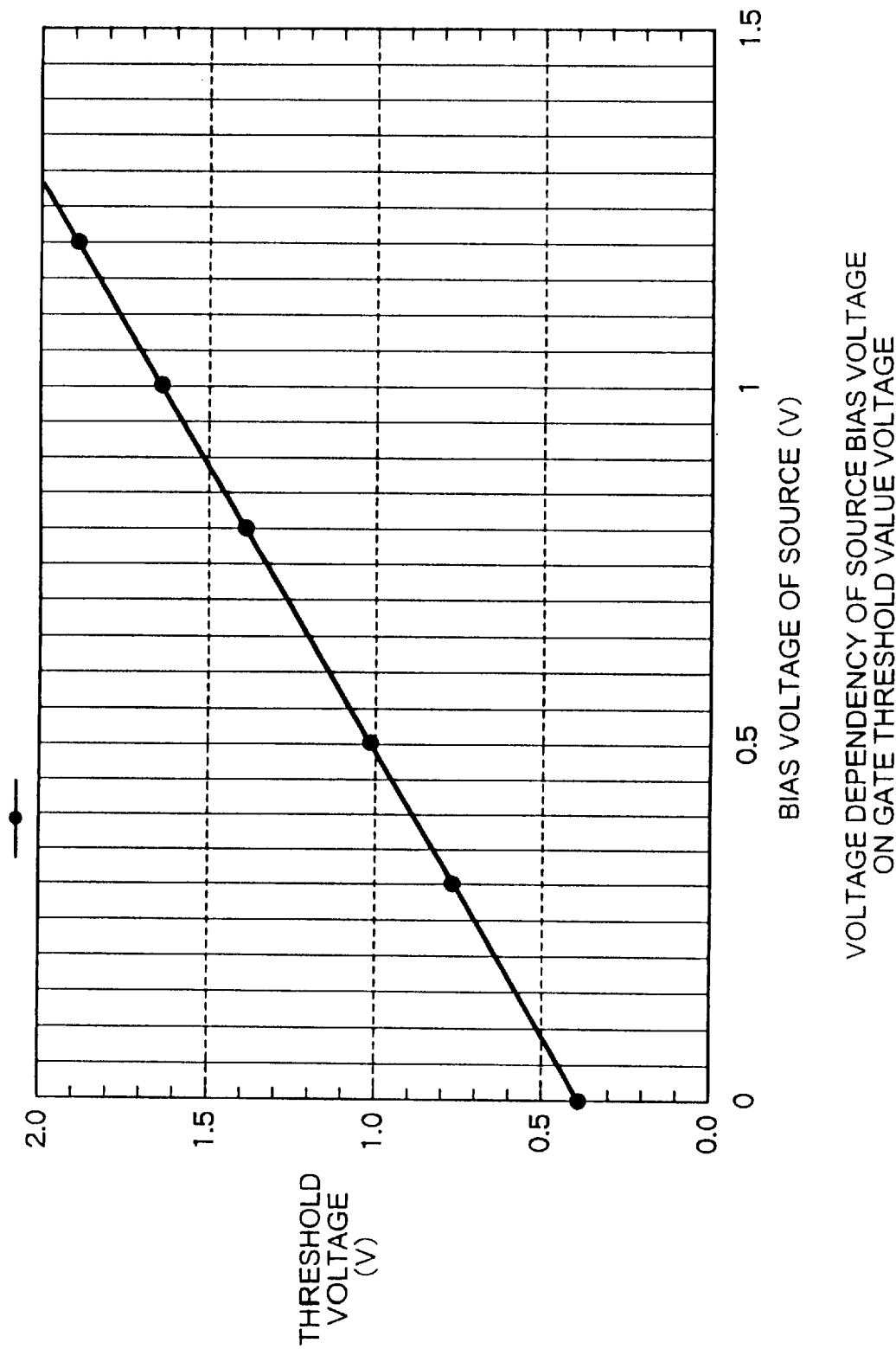
FIG. 3 is a graph of a relationship between a source bias voltage and a gate threshold voltage.

FIG. 3 is a graph of the relationship between the selected source line bias voltage Vs(sel) and the gate threshold voltage $V_{th}$.

It is seen from this graph that the gate threshold voltage $V_{th}$ linearly increases with respect to the selected source line bias voltage Vs(sel). Further, it was clarified that the proportional coefficient thereof was 1.26 or larger than 1. When the selected source line bias voltage Vs(sel) is set at 0.5V in the previous example, the gate threshold voltage $V_{th}$ greatly increases to 0.63V, therefore the gate threshold voltage $V_{th}$ lowered due to a deep writing in the erase state can be recovered.

Figure 4:
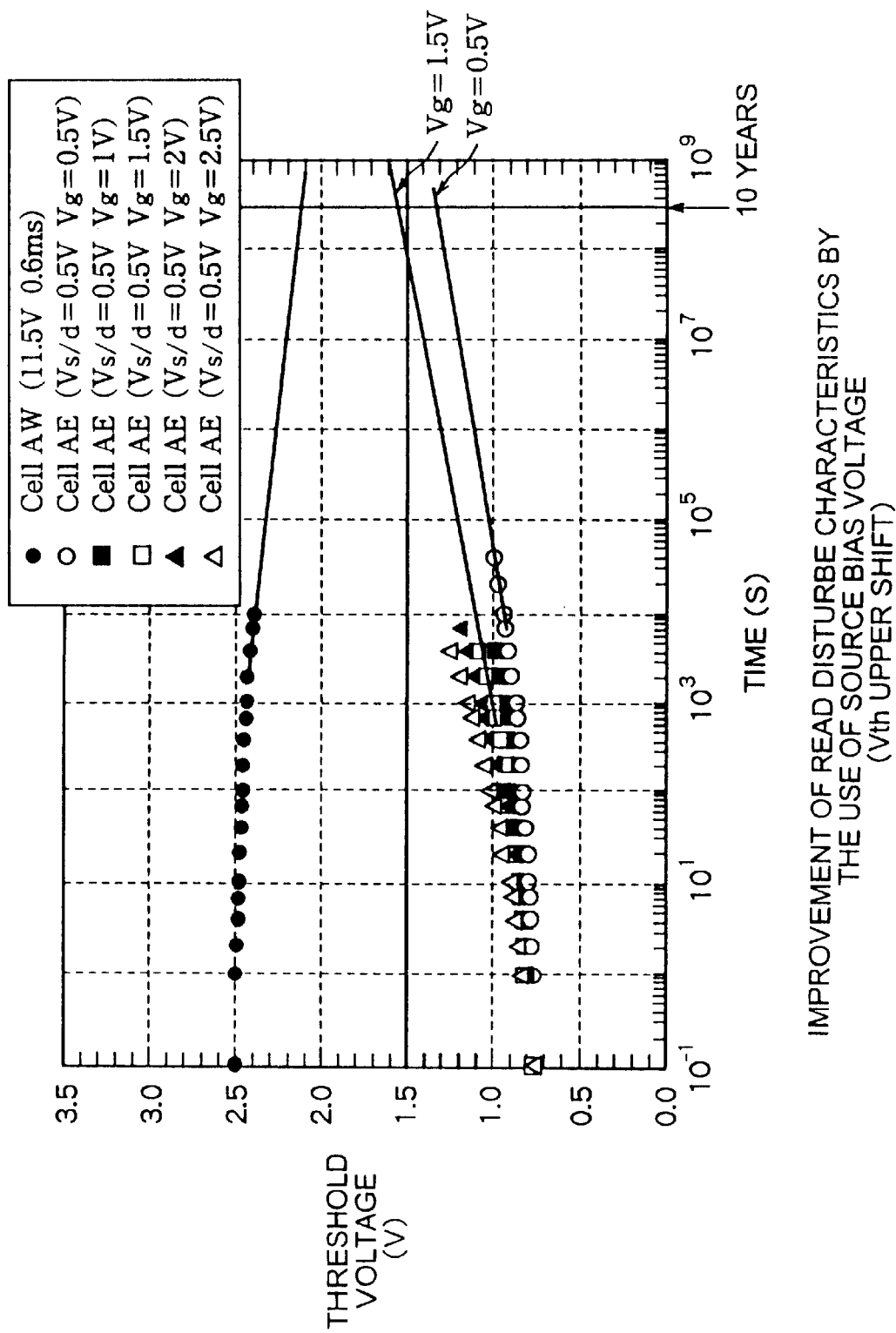
FIG. 4 is a graph of the read disturb characteristic when supplying 0.5V as a source bias voltage.

FIG. 4 shows the read disturb characteristic when 0.5V is supplied as the selected source line bias voltage Vs(sel). Note that, in this FIG. 4, the read disturb characteristic when reading the data of the non-selected memory cell A is shown for convenience for simultaneously showing the $V_{th}$ window width.

As apparent from comparison of this FIG. 4 with FIG. 25, it is seen that the gate threshold voltage $V_{th}$ linearly shifts upward by exactly 0.63V as a whole. Further, the gate threshold voltage $V_{th}(W)$ on the writing side after the linear shift of 0.63V could be made sufficiently high with respect to the read voltage of 1.5V. Accordingly, it was clarified that even the selected source line bias voltage Vs(sel) of about 0.5V was sufficient for avoiding the problem of the related art of the $V_{th}$ on the erasing side being lowered to near depletion or the gate threshold voltage $V_{th}(W)$ on the writing side becoming the read gate voltage or less. Note that there was no change in the gate threshold voltage difference ($V_{th}$ window width) per se of the writing side and the erasing side due to the application of the selected source line bias voltage Vs(sel).

Improvement of Read Disturb Characteristic of Non-selected Memory Cell A

Next, after explaining the voltage supplied to the gate insulating film 6, the effect (effect of improvement of the read disturb characteristic) by supplying a non-selected column bias voltage VS/D(unsel) to the source and drain of the non-selected transistor M21 by the column bias circuit 20 will be explained.

In the case of a MONOS type nonvolatile memory, a charge is held by planarly dispersed carrier traps, therefore when examining the amount of reduction of the gate threshold voltage $V_{th}$ due to the read disturb, the polarity and magnitude of the electric field of the channel vertical direction applied to the gate insulating film 6 (ONO film) become important.

When the gate voltage at the time of reading is 1.5V, if the voltage between the source region 2 and the drain region 4 of FIG. 1 is sufficient, a channel is formed in the channel forming region 1a sandwiched by these regions. In this case, the electric field applied on the channel part is defined by the difference between the gate application voltage and voltages of the source and drain. Namely, if the application voltage of the selected word line WL1 at the time of reading is Vg and the voltage of the source and drain is $V_{S/D}$, the voltage V effectively supplied on the gate insulating film 6 is represented by the following equation:

$$V = V_g - V_{S/D} \quad (1)$$

Figure 5:
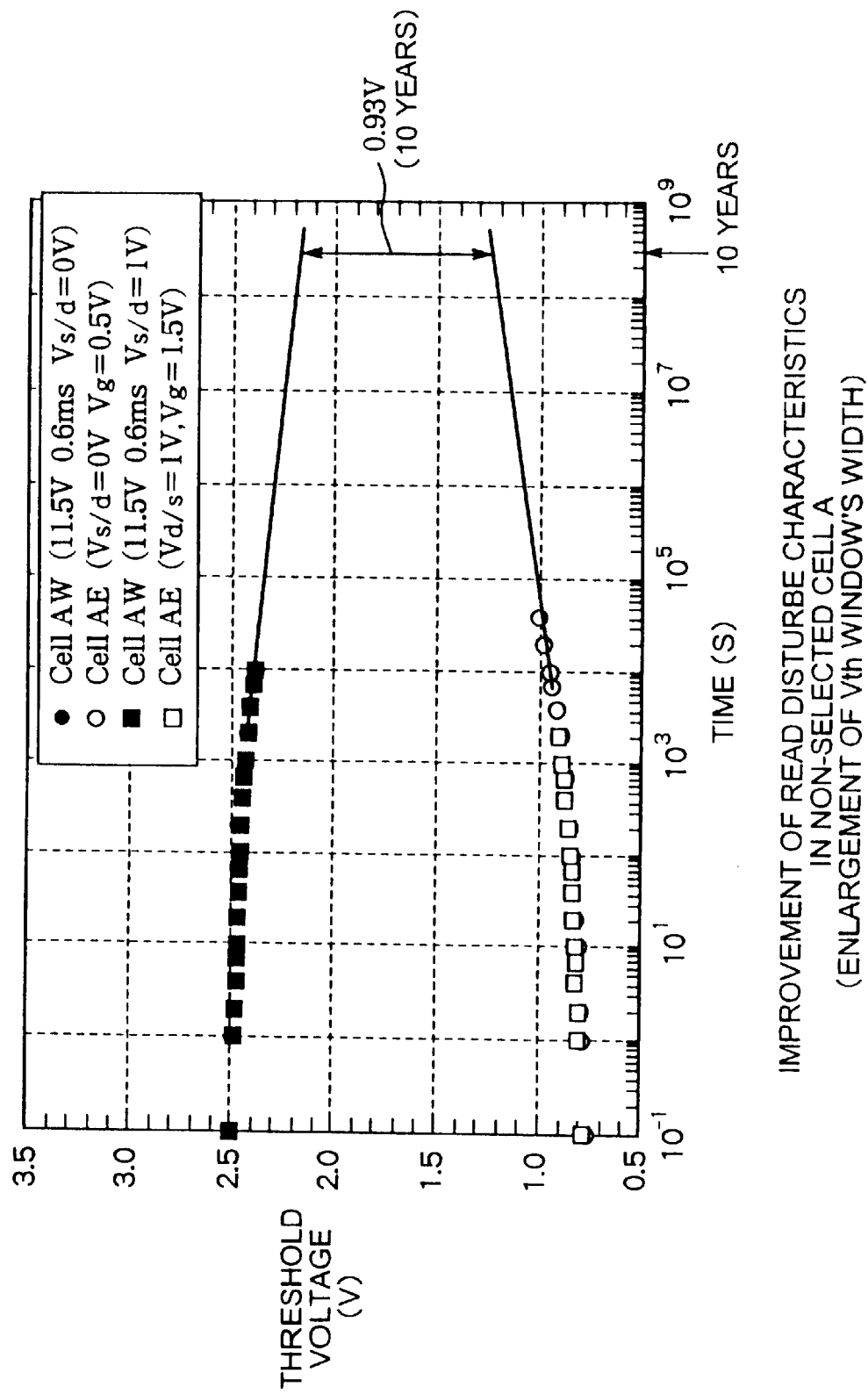
FIG. 5 is a graph of the read disturb characteristic of a non-selected memory cell A of FIG. 2 by using a gate voltage and source and drain voltage as parameters.

FIG. 5 shows the read disturb characteristic of the non-selected memory cell A using the gate voltage Vg and the source and drain voltage $V_{S/D}$ as parameters.

According to this FIG. 5, it Is seen that the read disturb characteristics in the case where the gate voltage Vg is 1.5V and the source and drain voltage $V_{S/D}$ is 1V and in the case where the gate voltage Vg is 0.5V and the source and drain voltage $V_{S/D}$ is 0V substantially coincide. That is, it became clear that if the voltage V supplied on the gate insulating film 6 in the above Equation (1) Is equal to 0.5V, the read disturb characteristics substantially coincide. Further, in this case, the $V_{th}$ window width after 10 years increases about two-fold.

Similarly, it can be easily deduced that, even in the case where the voltage V supplied on the gate insulating film 6 as in the example of the setting of the bias voltage is 1V, if the voltage values thereof are equal, the read disturb characteristic is improved and the $V_{th}$ window width is increased from that of the related art.

It has become clear from the above that, in the present embodiment, the application of the non-selected column bias voltage $V_{S/D}$(nonsel) to source and drain of the non-selected memory cell A by the column bias circuit 20 to reduce the effective electric field applied on the gate insulating film 6 has the effect of improving the read disturb characteristic. It was realized by other experiments that the fact that the channel forming region is not depleted up to the center portion thereof in the case of the prior art where the gate voltage is 0V is closely related to the reduction of the electric field. This effect of improvement can be considered to be a manifestation of the change of the polarity and magnitude of the electric field in the channel vertical direction in a direction in which charges are hard to inject.

Note that, although not particularly illustrated, it was confirmed that, even in a case where the gate voltage Vg is made as a high 3V so as to make high speed reading possible, if the non-selected column bias voltage VS/D (unsel) is set at 2.5V, improvement of the read disturb characteristic of the non-selected memory cell A is possible.

Endurance Characteristic, Read Disturb Characteristic after $10^6$ endurance W/E cycles Next, the endurance characteristic of the memory transistor was investigated.

Figure 6:
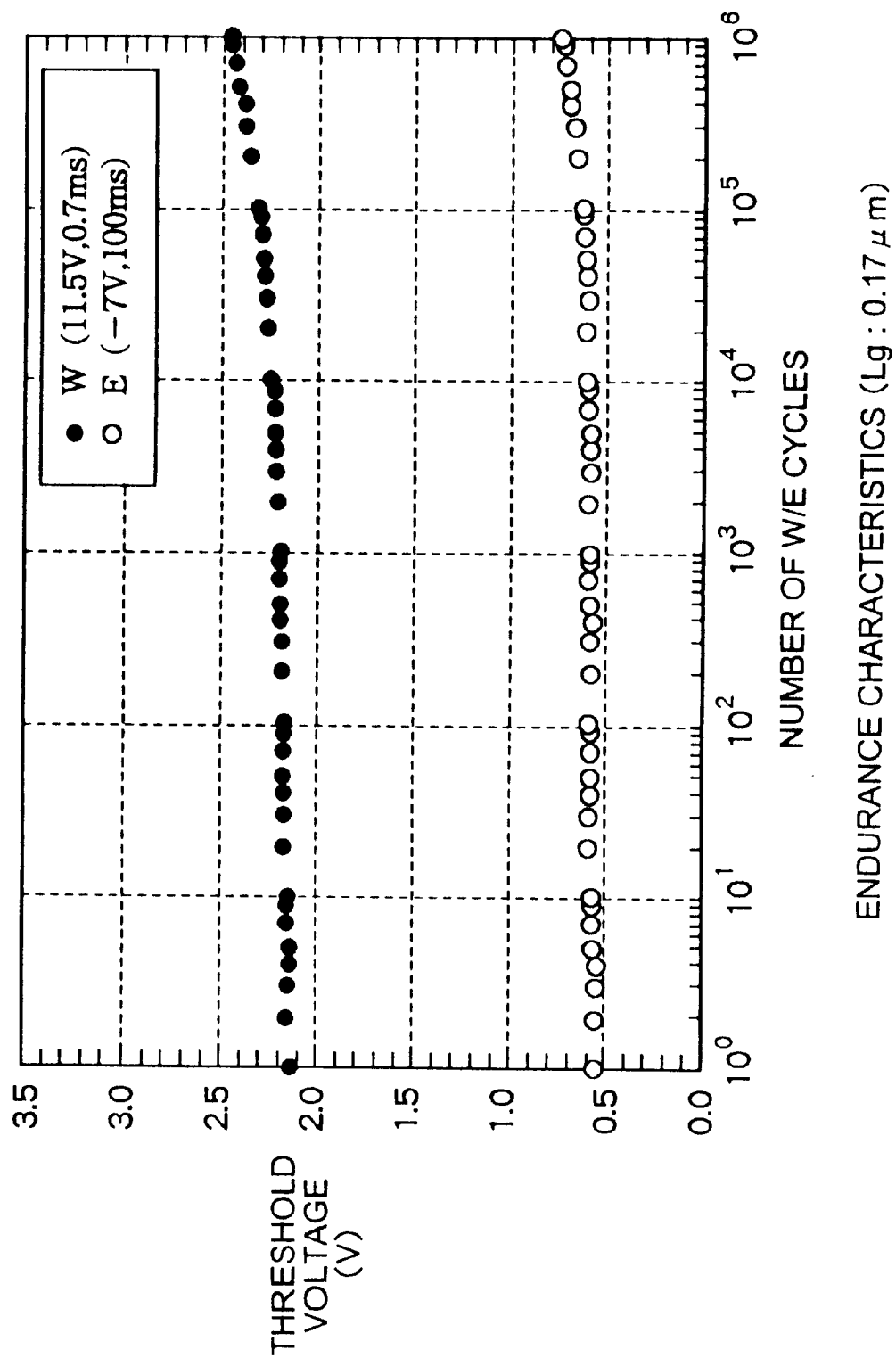
FIG. 6 is a graph of a endurance characteristics up to $10^6$ cycles in a memory transistor having a gate length of 0.17 $\mu$m.

FIG. 6 shows the endurance characteristics number of W/E cycles dependency of the gate threshold voltage $V_{th}$ when data is rewritten $10^6$ times in a memory transistor having a gate length of 0.17 $\mu$m.

It was found from FIG. 6 that, even after performing the data rewrite $10^6$ cycles, the gate threshold voltage $V_{th}$ did not change so much and there was no great fluctuation, reduction, etc. of the $V_{th}$ window width.

The read disturb characteristic of the non-selected memory cell A and the selected memory cell S after endurance W/E cycles rewrite were investigated.

Figure 7:
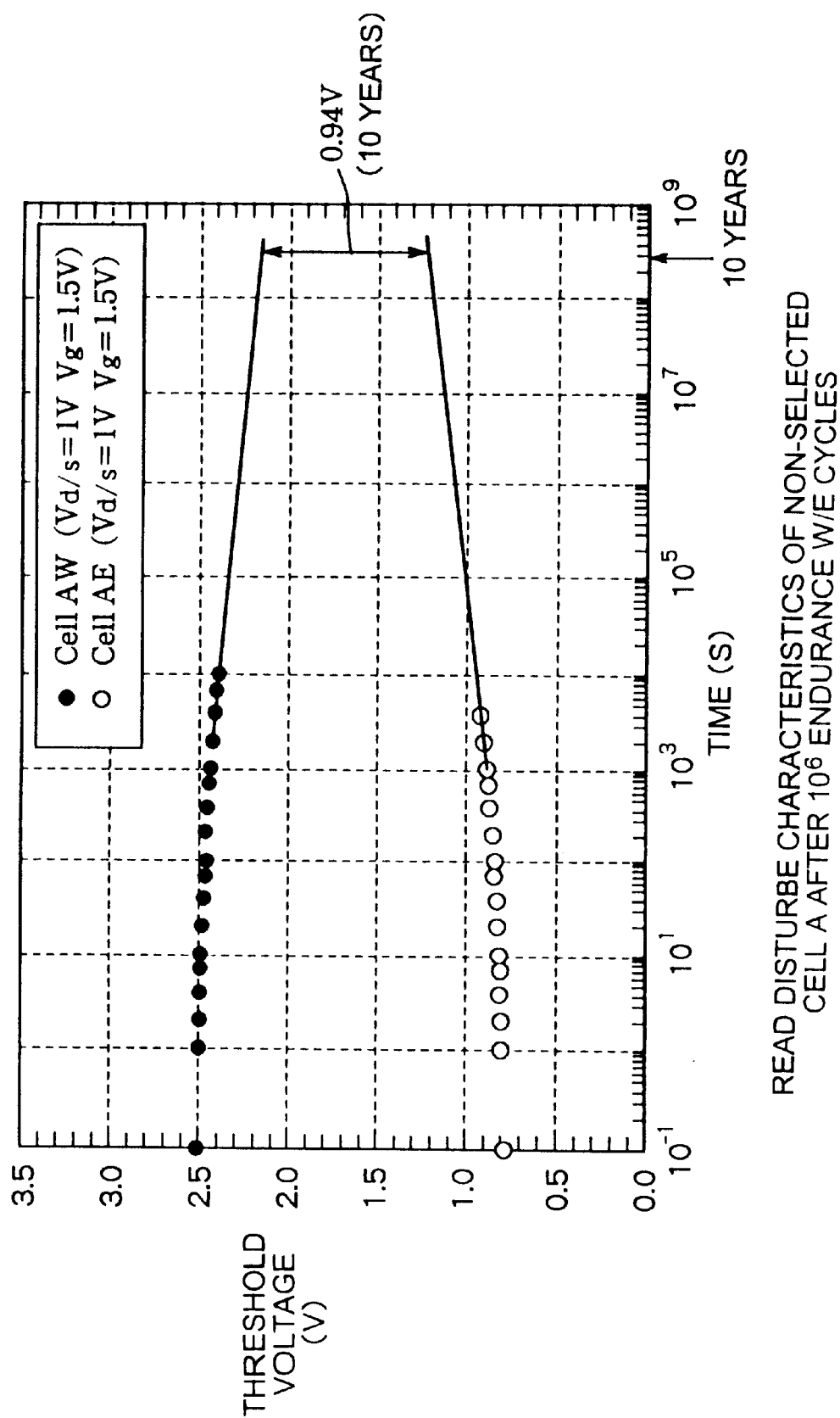
FIG. 7 is a graph of the read disturb characteristic of a non-selected memory cell A after $10^6$ endurance W/E cycles.

FIG. 7 shows the read disturb characteristic of the memory cell A after $10^6$ endurance W/E cycles. Here, both of the drain read voltage (voltage supplied to the selected bit line BL1) and the read gate voltage (voltage supplied to the selected word line WL1) were set at 1.5V and the non-selected column bias voltage $V_{S/D}$(nonsel) was set at 1V. Note that the gate length of the memory transistor at this time is a 0.18 $\mu$m generation.

In FIG. 7, the measured data was linearly extrapolated to find the gate threshold voltages $V_{th}(W)$ and $V_{th}(E)$ in the write state and the erase state after 10 years. The $V_{th}$ window width was found from the difference of the two. As a result, it was seen that the $V_{th}$ window width was about 0.94V even after an elapse of 10 years after $10^6$ endurance W/E cycles and satisfied the practical and desirable $V_{th}$ window width of 0.5V or more after 10 years endurance.

Next, under the same conditions, the read disturb characteristics of the selected memory cell S and non-selected memory cells B and C having a possibility of being subjected to a read disturb were evaluated.

Disturb Characteristic of Selected Memory Cell S

In the selected memory cell S, the read gate voltage becomes 1.5V, the read drain voltage becomes 1.5V, and the source voltage Vs becomes (about 0 to 0.5V). Also in this case, it was confirmed that the $V_{th}$ window width after 10 years was 0.5V or more. Further, it was confirmed that, when a positive bias voltage Vs (about 0.5V) is supplied to the selected source line SL1, in comparison with the usual case where Vs=0V, the read disturb characteristic of the selected memory cell S was improved.

Read Disturb Characteristic of Non-selected Memory Cell B

Figure 8:
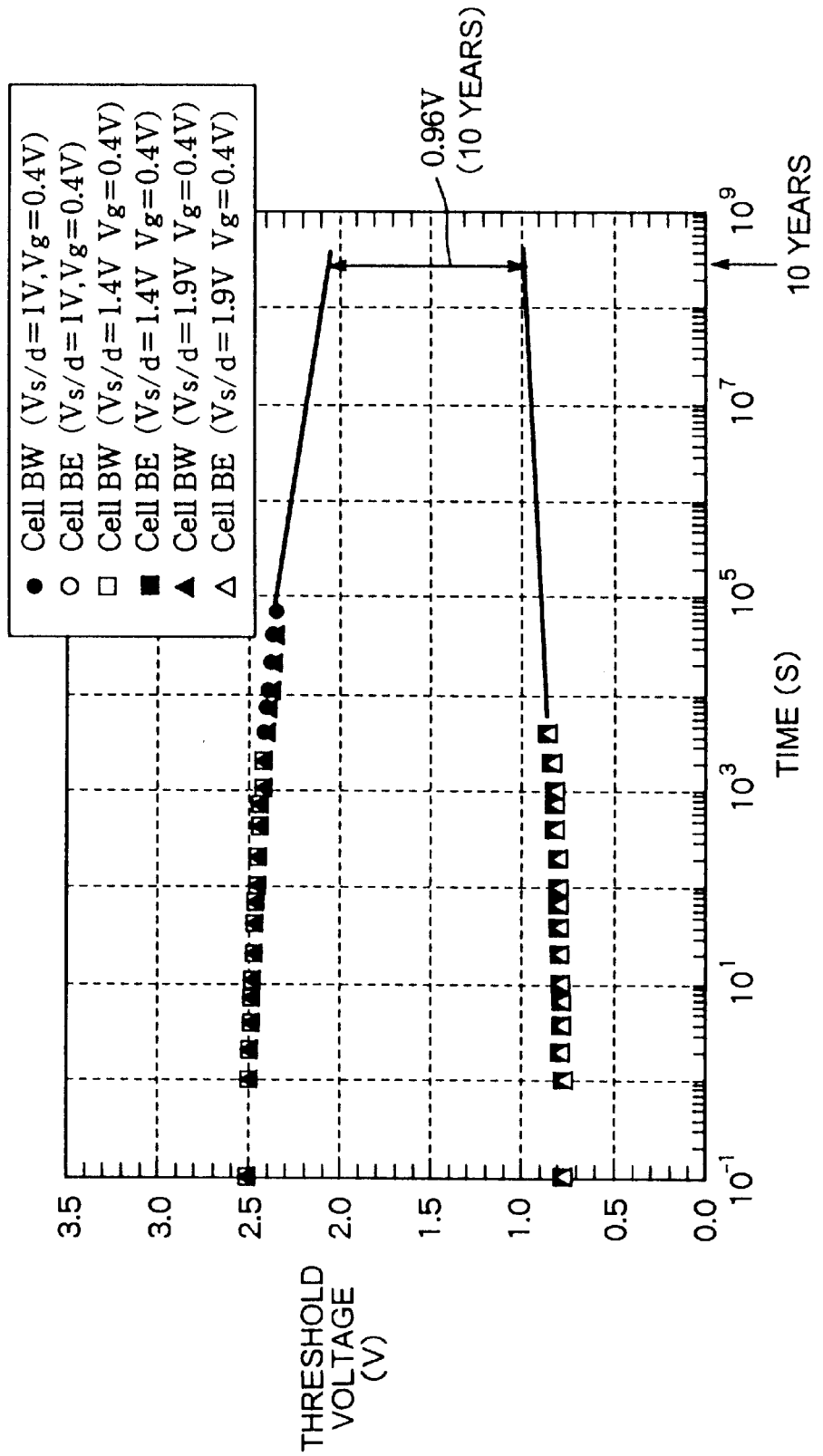
FIG. 8 is a graph of the read disturb characteristic of a non-selected memory cell B after $10^6$ endurance W/E cycles.

FIG. 8 is a graph of the read disturb characteristic of the non-selected memory cell B after $10^6$ endurance W/E cycles. Here, the read drain voltage and the read gate voltage were made 1.5V or the same as the case of FIG. 7, but the non-selected column bias voltage $V_{S/D}$(nonsel) was used as the parameter and the cases where the value thereof was 1V, 1.4V, and 1.9V are shown. Further, the row bias circuit 22 supplied a voltage of 0.4V or substantially equal to the selected source line bias voltage to the non-selected word line WL2.

As shown in FIG. 8, it was seen that, in each of the cases where the non-selected column bias voltage $V_{S/D}$(nonsel) was changed, read disturb characteristics were substantially the same and also the $V_{th}$ window width after 10 years of 0.5V or more was secured with a safety margin. Further, it could be confirmed that, even if the non-selected column bias voltage $V_{S/D}$ (nonsel) is further raised up to 2.4V, the $V_{th}$ window width after 10 years of the practical standard (0.5V) could be secured.

Read Disturb Characteristic of Non-selected Memory Cell C

Figure 9:
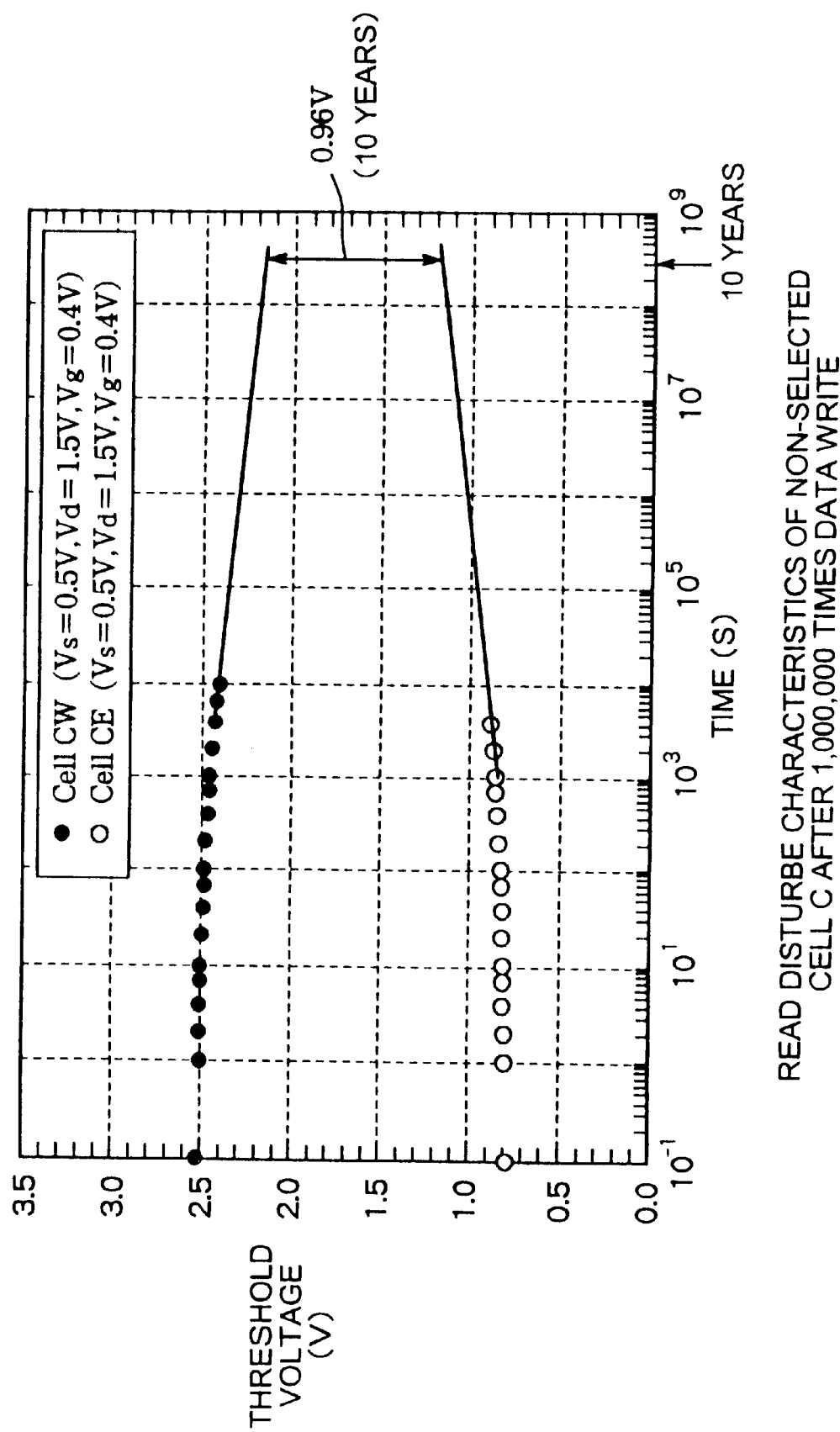
FIG. 9 is a graph of the read disturb characteristic of a non-selected memory cell C after $10^6$ endurance W/E cycles.

FIG. 9 is a graph of the read disturb characteristic of the non-selected memory cell C after $10^6$ endurance W/E cycles. Here, the read drain voltage and the read gate voltage were made 1.5V or the same as the case of FIG. 8, and the row bias circuit 22 was used to supply a voltage of 0.4V or substantially equal to the selected source line bias voltage to the non-selected word line WL2. Note that the non-selected memory cell C as hares the source line with the selected memory cell S, therefore the source voltage Vs is 0.5V.

In this non-selected memory cell C as well, it was Found that a $V_{th}$ window width after 10 years of 0.5V or more could be secured.

Further, FIG. 9, the non-selected word line voltage dependency of the $V_{th}$ window width was investigated for the case where the non-selected word line voltage was set at 0.4V and the bit line voltage at the time of reading was 1.5V. As a result, it was seen that, if the non-selected word line voltage is 0V to 0.6V, the extrapolated value of the $V_{th}$ window width after 10 years was 0.5V—which satisfies the practical standard for 10 years.

It could be confirmed from the above that, when reading the selected memory cell data, by supplying a positive voltage to the source line and the bit line of the non-selected column, the read disturb characteristic of the non-selected memory cell A in the short gate length region shorter than 0.2 µm is greatly improved and that, in the MONOS type single-transistor memory cell operation of the current 0.18 µm generation, the read precision and reliability thereof were improved.

Further, the results of the study suggests that it is possible to raise the non-selected column bias voltage $V_{S/D}$(nonsel) and the non-selected row gate bias voltage $V_g$(nonsel) even in the generation of 0.18 µm and subsequent generations where the gate length is further shortened to for example 0.13 µm and that it is possible to secure a practical read disturb characteristic.

Further, in the evaluation of the read disturb characteristic of the non-selected memory cell B, it was seen that a voltage up to at least 2.4V could be supplied to the non-selected source line SL2 and the non-selected bit line BL2. As a result, it was shown that it became possible to increase the read gate voltage from the current 1.5V to 3V and that the drain current at the time of reading could be made larger. If the drain current at the time of reading is large, it becomes possible to make the read speed using a sense amplifier higher by that amount.

Above, the evaluation of characteristics and the results of the study relating to the read disturb characteristic in the present embodiment were explained. The application of the source and drain voltages of the present example reverse biases the pn junction of the substrate with respect to the substrate (element forming region). Accordingly, it is necessary to check if there is a problem in the breakdown voltage of the junction and confirm the principal device characteristics.

Breakdown Voltage of Memory Transistor

Figure 10:
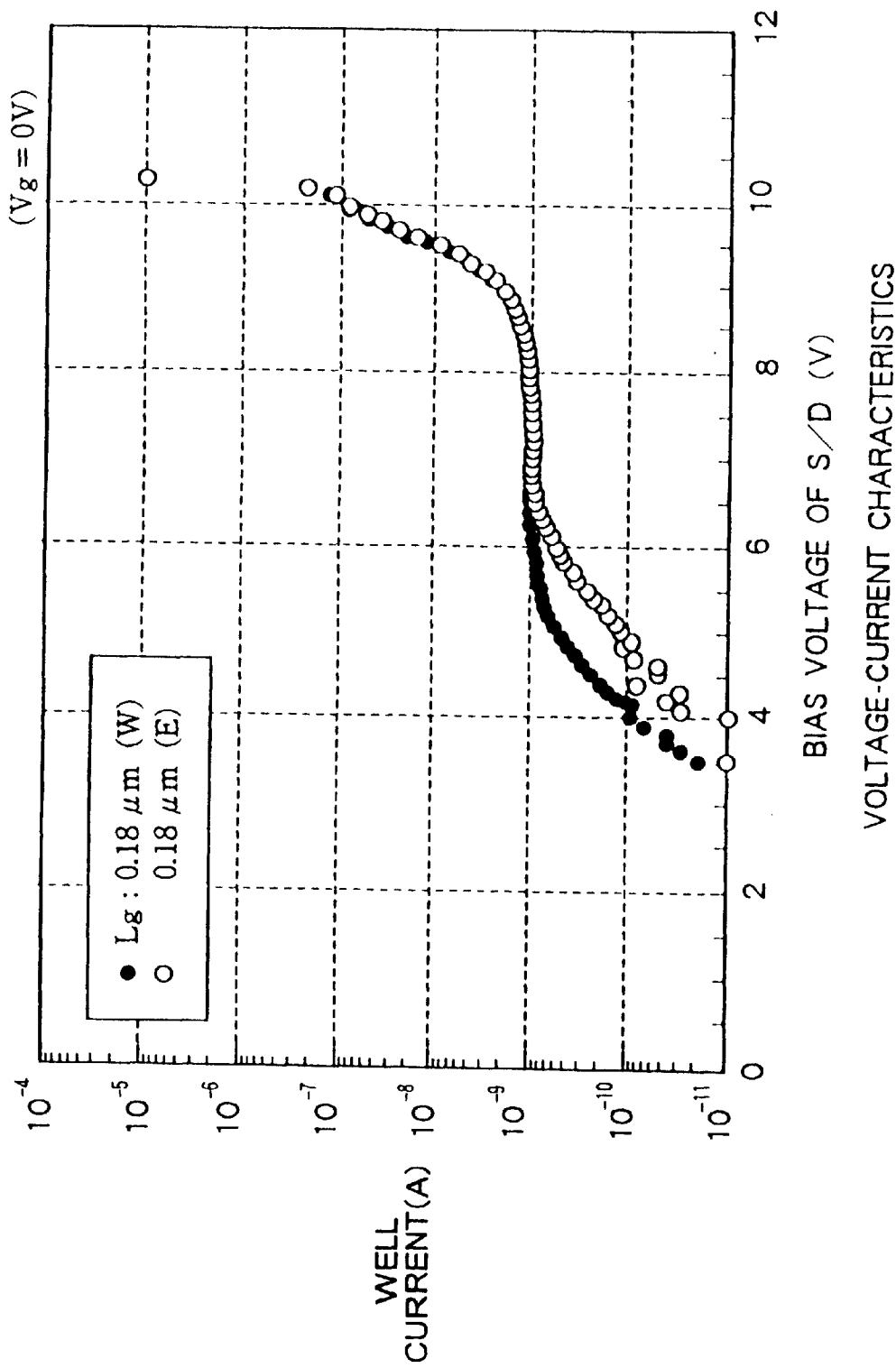
FIG. 10 is a view of both cases of a written state and an erased state for a current-voltage characteristic where the gate voltage is 0V.

FIG. 10 shows both the cases of the written state and erased state for a current-voltage characteristic when the gate voltage is 0V.

As a result, it was seen that the breakdown voltage of the junction was about 10V and did not depend upon the written state and the erased state. However, it is found that the rising voltage in the sub-breakdown region near 3V to 5V is different between the written state and the erased state.

Figure 11:
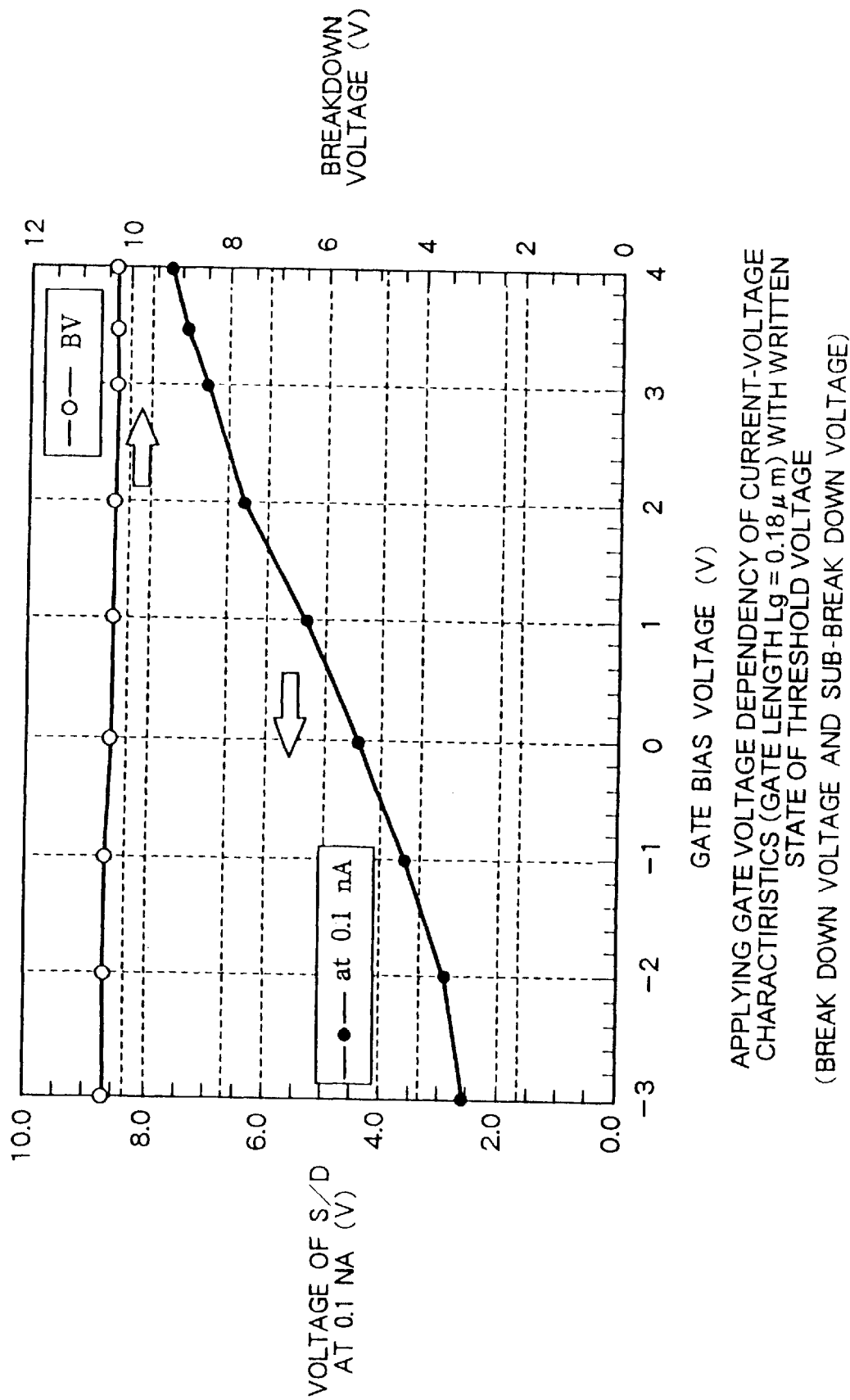
FIG. 11 is a view of the gate voltage dependency of the current-voltage characteristic in the written state.

FIG. 11 shows the gate voltage dependency of the current-voltage characteristic in the written state. The breakdown voltage did not exhibit any gate voltage dependency, while the rising voltage in the sub-breakdown region exhibited gate voltage dependency. The sub-breakdown region is considered to be caused by an interband tunnel phenomenon at the surface of the gate edge portion, but the current level is small, therefore it can be considered that there is no problem here. Further, also the breakdown voltage of about 10V is sufficiently larger than the non-selected column bias voltage in the read disturb characteristic, therefore it can be considered that it does not exert a direct influence upon the inhibit characteristic of the read disturb characteristic. It was found from the above that, in a 0.18 µm MONOS type memory transistor, the junction breakdown voltage thereof did not become a limiting factor on the read disturb characteristic.

Further, it was also confirmed that the punch through breakdown voltage of the non-selected memory cell was sufficiently large at the time of reading.

Principal Device Characteristics

Figure 12:
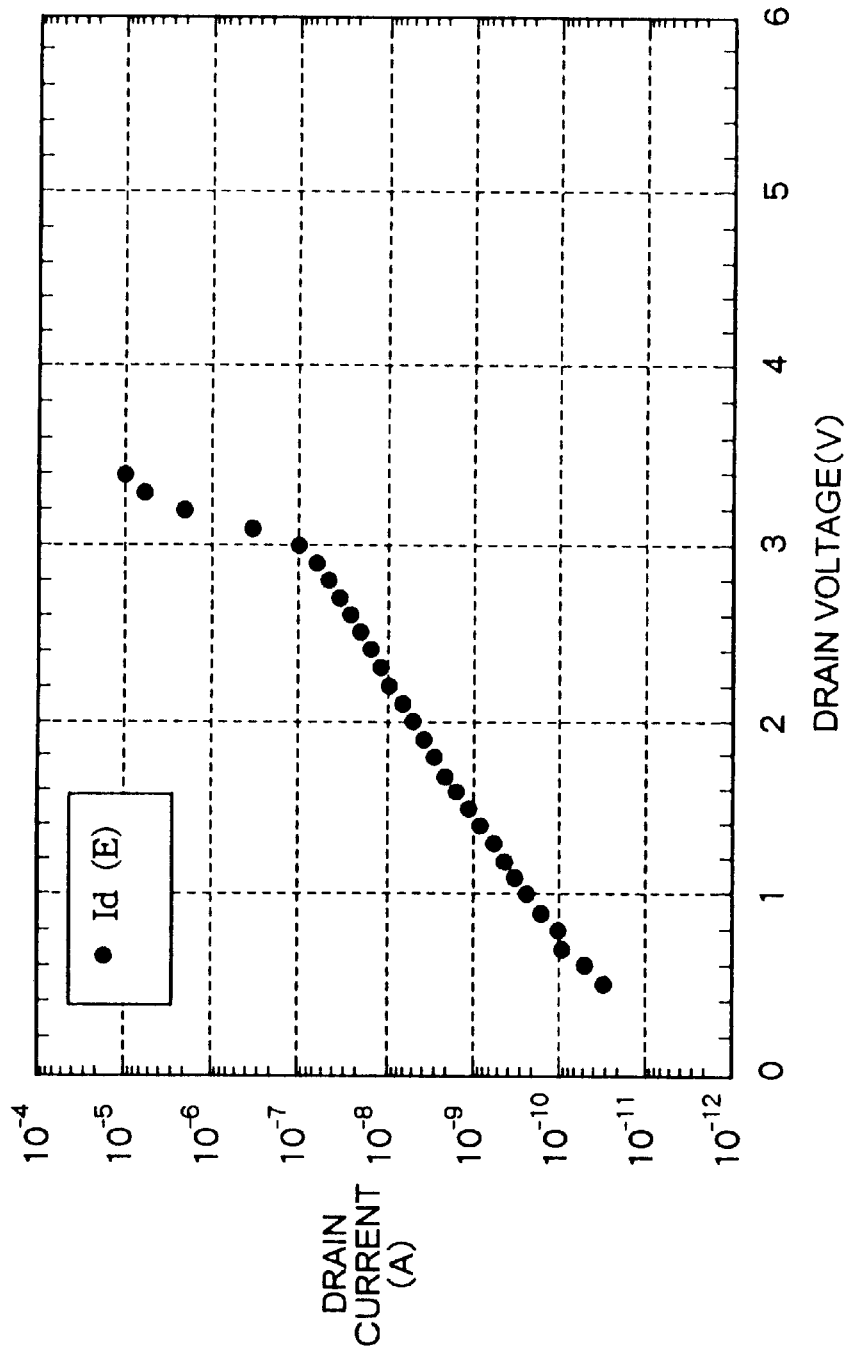
FIG. 12 is a view of the current-voltage characteristic in a cut-off region.

FIG. 12 shows the current-voltage characteristic of the memory transistor when the gate voltage is 0V. This FIG. 12 shows the measured data of the voltage and the current between the source and the drain for a MONOS type memory transistor when the gate width is 10 µm and in the erased state (gate threshold voltage $V_{th}$: about 0.5V) in the case where the gate voltage thereof is 0V.

It is seen from FIG. 12 that the current value of the non-selected memory cell when the drain voltage is 1.5V is about 1 µA. It was seen from the figure that the punch through current in the non-selected memory cell, which becomes a problem at the time of reading, was suppressed low.

Figure 13:
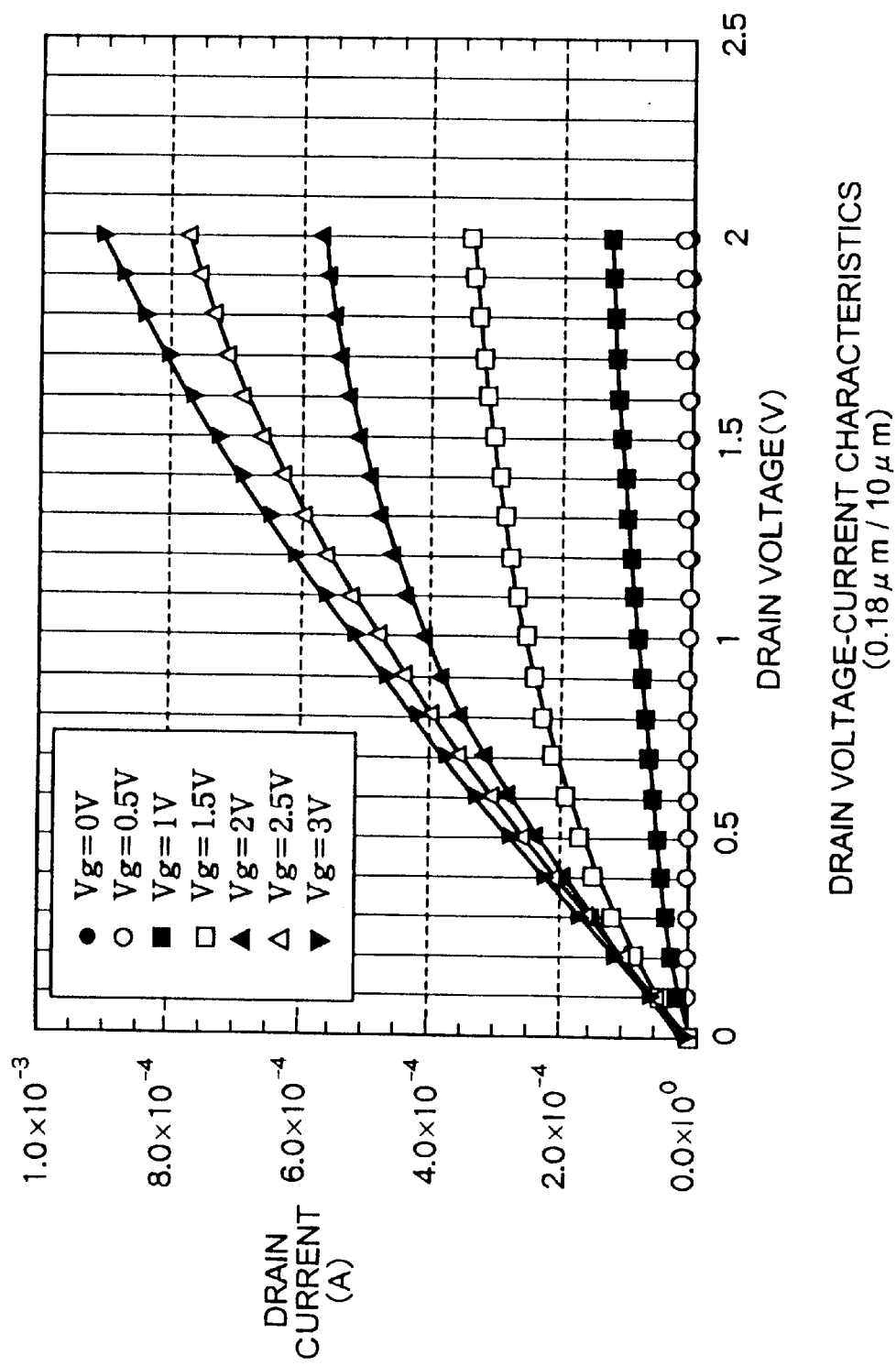
FIG. 13 is a view of the drain voltage dependency of the drain current.

FIG. 13 shows the drain voltage dependency of the drain current. The drain current (read current) when the gate voltage Vg is 1.5V was about 310 μA. It was seen that the ratio of the currents flowing from the selected memory cell and the non-selected memory cell could be 5 figures when the gate voltage is 1.5V and the drain voltage is 1.5V. For this reason, occurrence of erroneous reading from the non-selected memory cell can be effectively prevented.

Figure 14:
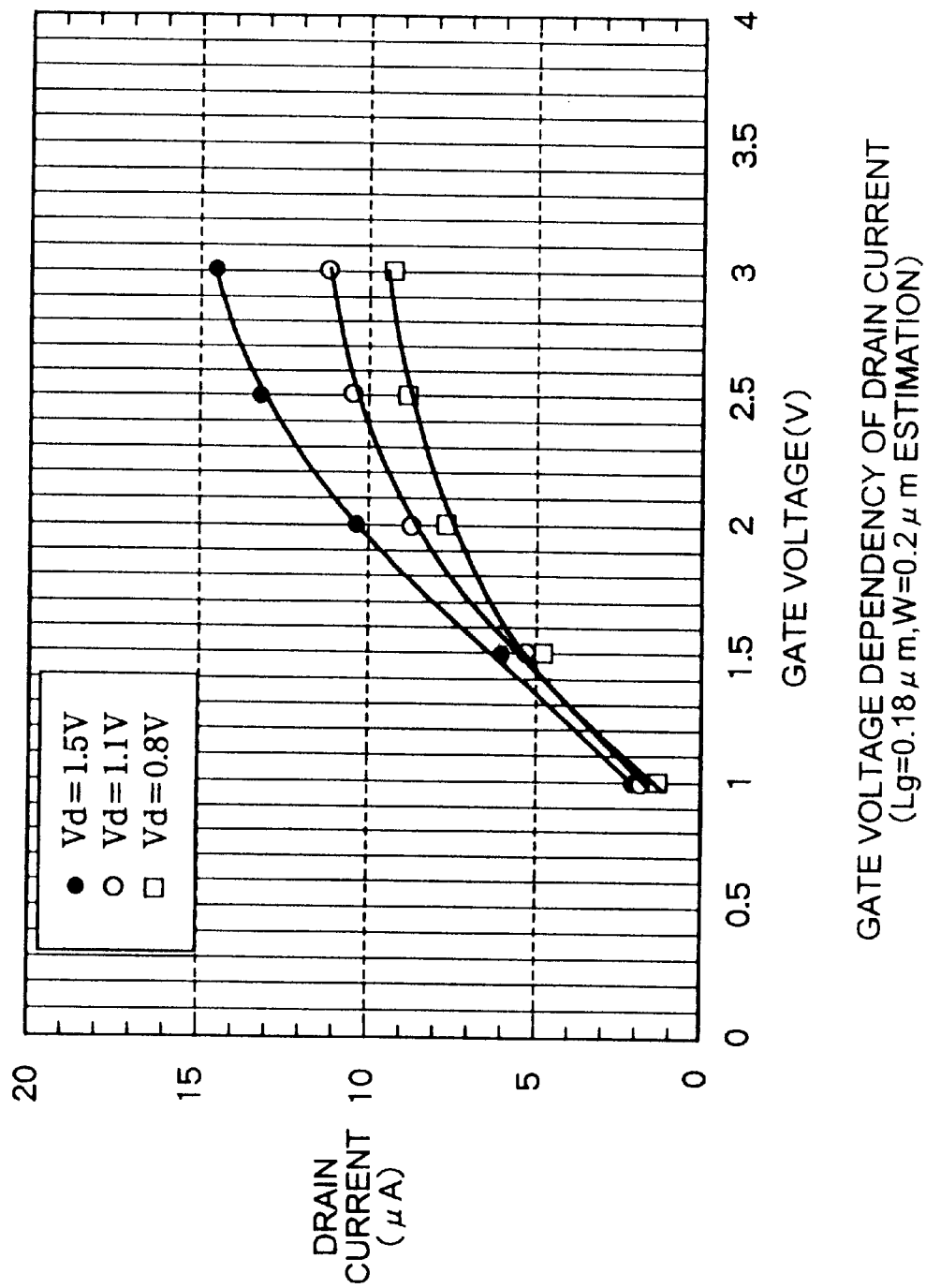
FIG. 14 is a view of the gate voltage dependency of the drain current when a gate length is 0.18 $\mu$m and a gate width is 0.2 $\mu$m.

Further, FIG. 14 shows the gate voltage dependency of the drain current when the gate length is 0.18 μm and the gate width is 0.2 μm. The drain current when the gate voltage is 1.5V and the drain voltage is 1.5V was about 6 μA. By supplying a positive bias voltage to the source line and the bit line, even if the gate voltage is made a high 3V, the drain current was not so saturated and, as a result, it became possible to increase the drain current up to about 14 μA. It is seen from FIG. 14 that the drain current has become 2.3 times larger compared with the time when the gate voltage is 1.5V.

The fact that a large increase of this drain current is possible shows that an increase of speed of the read operation can be achieved by increasing the operating speed of the sense amplifier 2.3 fold since the operating speed of the sense amplifier at the same sensitivity of the sense amplifier is proportional to the magnitude of the drain current.

Note that, the endurance characteristic of the data is good and satisfies $10^6$ W/E cycles as shown in the previous FIG. 6. This can be considered to be because the carrier traps are made planarly dispersed and deep in the MONOS type, so the charges are hard to eject. Further, the data retention characteristic satisfies 85° C. for 10 years even after $10^6$ endurance W/E cycles as previously mentioned.

In the present embodiment, by supplying a positive voltage to the source and the drain of the memory transistor M21 belonging to the non-selected column, the effective electric field applied on the gate insulating film 6, particularly the tunnel insulating film 10 at which the charges are transferred, can be reduced. As a result, a so-called "soft write" where the gate threshold voltage $V_{th}(E)$ of the non-selected memory transistor M21 in the erase state increases along with an elapse of time according to aging is prevented and the read disturb characteristic of the non-selected memory cell A is improved.

Further, the read gate voltage (voltage supplied to the selected word line BL1) can be made high within a range where this read disturb characteristic does not cause a problem, and high speed reading becomes possible by that amount. For example, it was found that, even if the read gate voltage is increased from the usual 1.5V to 3V, a sufficient margin of the inhibit voltage could be obtained in the read disturb characteristic. In the MONOS type nonvolatile memory, the read speed is improved about two-fold by an increase of the selected word line voltage by 1V. Accordingly, by increasing the word line voltage at the time of reading from 1.5V to 3V, the read speed is improved about two-fold.

On the other hand, just by raising the source voltage of the selected memory transistor M11 somewhat, the gate threshold voltage $V_{th}$ of the selected memory transistor M11 can be raised exceeding the rise. For this reason, one aspect of the short channel effect which has become more and more conspicuous due to miniaturization of elements, that is, the reduction of the gate threshold voltage $V_{th}$ due to roll-off, can be easily compensated for. Further, from the viewpoint of making the amount of the $V_{th}$ shift large, the problem of lowering of the erased side $V_{th}$ occurring since the $V_{th}$ on the erasing side is deeply erased can be avoided.

As a result, the problem of the prior art of a leakage current flowing to the non-selected memory cell and this lowering the read precision of the bit line current is avoided, and the replacement of a two transistor memory cell with a single-transistor memory cell becomes easy. Further, increasing the gate threshold voltage $V_{th}$ results in a broadening of the valid $V_{th}$ distribution region of multivalue data and this contributes to the realization of a multivalue memory.

Further, it becomes possible to raise the voltage of the non-selected word line WL2 up to a voltage of an extent substantially the same as this source bias voltage and, as a result, it becomes possible to prevent the deterioration of the disturb characteristics of the non-selected memory cells B and C or improve the same.

These various effects were confirmed in the 0.18 μm generation. Further, it could be experimentally confirmed that there is a similar effect in the 0.13 μm generation as well. Further, it could be experimentally shown that the possibility of obtaining this effect even in generations after the 0.13 μm generation is high.

Further, as a result of experimental studies on the breakdown voltage of transistors, it was seen that the transistor breakdown voltage was larger than the voltages of the source and the drain supplied to the non-selected memory cell and did not become a limiting factor on the read inhibit characteristic at the time of reading. It was also confirmed that there was no influence upon the principal device characteristics.

It could be confirmed from the above that sufficient characteristics could be obtained in a MONOS type non-volatile memory transistor of the 0.18 μm generation.

Finally, an explanation will be made of a concrete example of a fine NOR type memory cell structure to which the present invention can be preferably applied.

Figure 15:
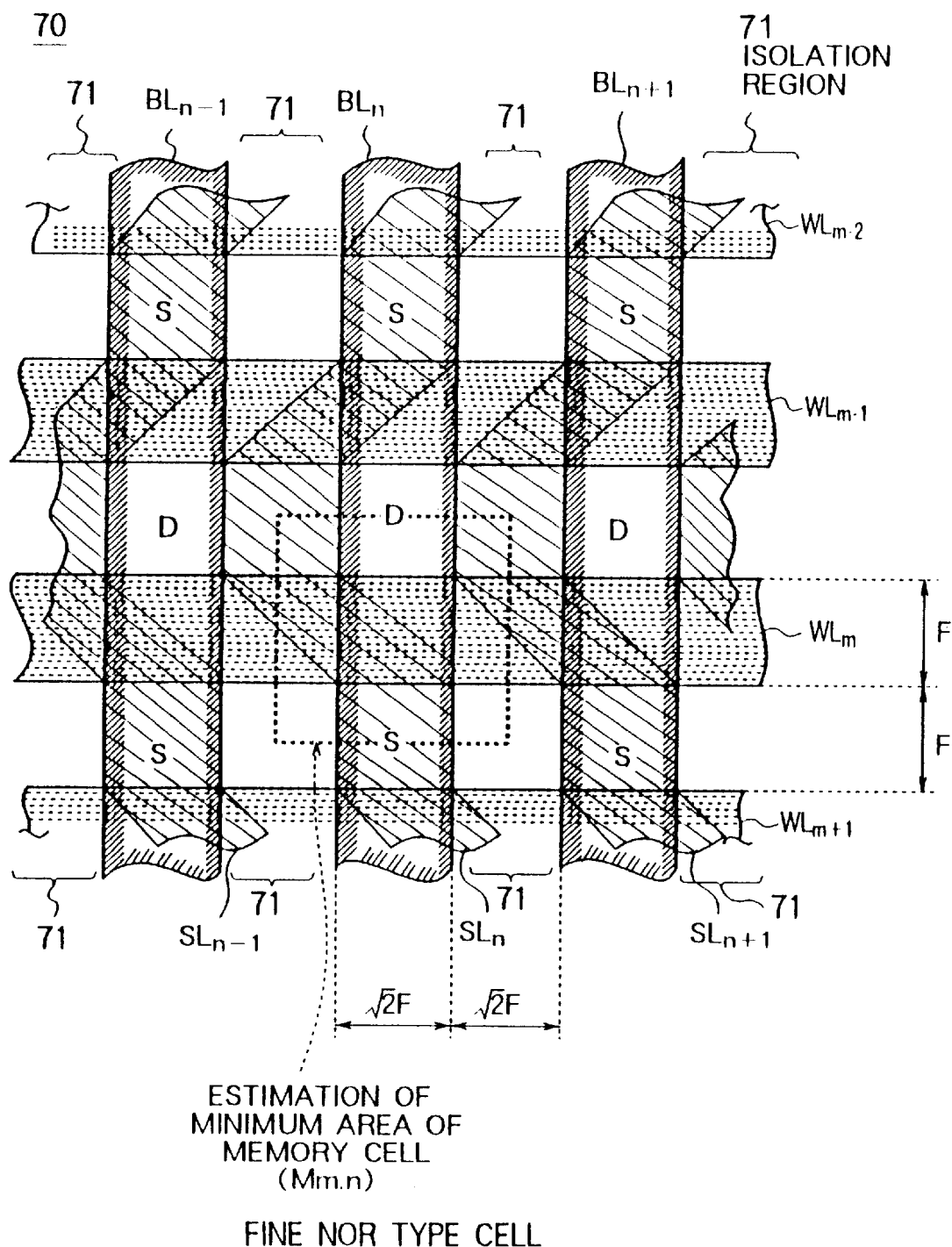
FIG. 15 is a schematic view of a fine NOR type memory cell using a self aligned technique and a serpentine source line as an example of the memory cell structure to which the present invention can be applied.

Miniature NOR Type Memory Cell Using Self-aligned Technique and Meandering Source Line FIG. 15 is a schematic view of a miniature NOR type memory cell array using a self-aligned technology and a serpentine source line.

In this miniature NOR type memory cell array 70, vertical stripe-like element isolation regions 71 such as trenches or LOCOS are arranged on the surface of a not illustrated p-well at equal intervals in a bit line direction (vertical direction of FIG. 15). Word lines $WL_{m-2}$, $WL_{m-1}$, $WL_m$, and $WL_{m+1}$ are arranged at equal intervals substantially orthogonal to the element isolation regions 71. The gates connected to these word lines are constituted by for example, similar to FIG. 1, a stacked film of the tunnel insulating film, nitride film, top oxide film, and gate electrode.

In the active regions within the spaces between the element isolation regions, for example an n-type impurity is introduced into the spaces between the word lines with a high concentration to alternately form the source regions and the drain regions. The sizes of these source regions and drain regions are defined only by the distance between the miniature element isolation regions (mainly trench element isolation regions) 71 in the word line direction (lateral direction in FIG. 15) and are defined only by the distance between the word lines in the bit line direction. Accordingly, looking at the variations in the size and arrangement of source regions and drain regions, almost no error of mask alignment is introduced, therefore the regions are extremely uniformly formed.

At the periphery of each word line, by Just forming side walls, contact holes for connecting the bit lines and contact holes for connecting the source lines are formed with respect to the source regions and drain regions while simultaneously using the self aligned contact technique twice. In addition, a photomask becomes unnecessary in the above process. Accordingly, as previously explained, in addition to the fact that the sizes and arrangements of source regions and drain regions are uniform, the sizes of the contact holes for connecting the bit lines or source lines formed secondarily by self aligned technique with respect to this become extremely uniform. Further, the contact holes have substantially the maximum limit of size with respect to the surface areas of the source regions and the drain regions.

Source lines $SL_{n-1}$, $SL_n$, and $SL_{n+1}$ arranged on this in the bit line direction are arranged in a serpentine manner on the element isolation regions 71 and the source regions while avoiding the drain regions and are connected to the source regions serving as the lower layer via the contact holes for connecting the source lines. On the source lines, bit lines $BL_{n-1}$, $BL_n$, and $BL_{n+1}$ are arranged at equal intervals via the second interlayer insulating film. These bit lines are located above active regions and are connected to drain regions serving as the lower layer via the contact holes for connecting bit lines.

In a memory cell pattern of such a structure, as described above, the formation of the source regions and the drain regions is not affected much by mask alignment and also the contact holes for connecting bit lines and the contact holes for connecting source lines are formed by using the self-aligned technique together twice, therefore the contact holes do not become limiting factors in the reduction of the memory cell area, and the source interconnections etc. can be formed at the smallest line width F of the wafer process limit. In addition, there is almost no wasted space, so a very small memory cell area of about $6F^2$ can be realized.

Note that in this memory cell structure as well, an operation for inhibiting erroneous reading of the selected memory cell and the non-selected memory cells according to the previously mentioned embodiment is applied.

Figure 16:
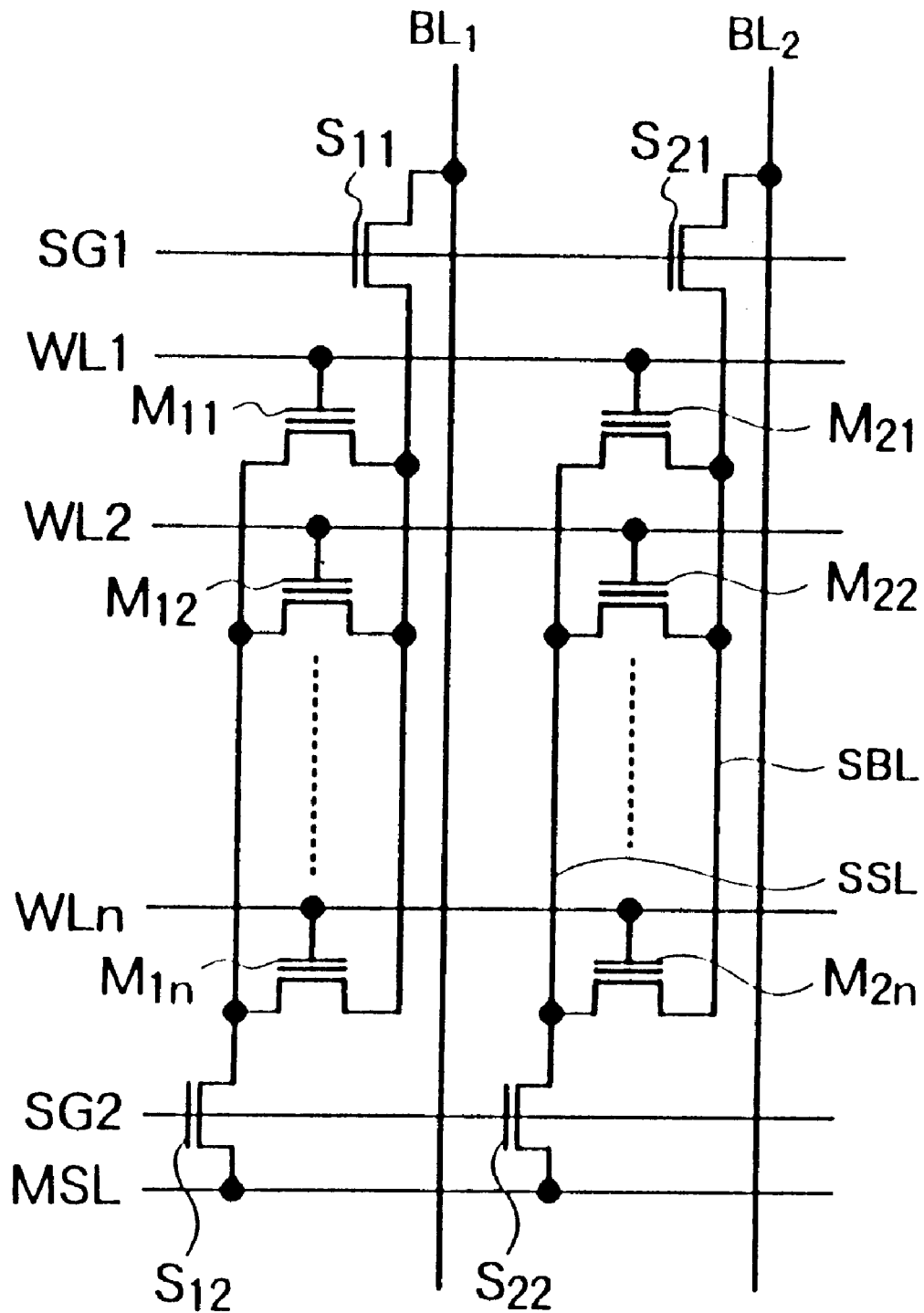
FIG. 16 is a circuit diagram of a fine NOR type memory cell array in which bit lines and source lines are formed hierarchically as an example of a memory cell system to which the present invention can be applied.

NOR Type Memory Cell in Which Bit Lines And/ or Source Lines Are Formed Hierarchically FIG. 16 shows the circuit configuration with a separated source line type miniature NOR type memory cell array in which bit lines and source lines are formed hierarchically.

One unit is constituted by a plurality of unit memory cell transistors M11 to M1n or M21 to M2n inserted (connected or coupled) between a sub bit line SBL and a sub source line SSL in parallel and two selection transistors S11 and S12 or S21 and S22 respectively connecting the sub interconnections SBL and SSL to the main interconnections (bit lines BL1 and BL2 or source lines SL1 and SL2).

The characteristic features thereof reside in that, first, the bit lines and source lines are formed hierarchically; second, it has a pseudo-contactless structure where the sub interconnections are comprised by a diffusion layer; and third, it adopts an operation for writing the entire channel and for erasing the entire channel.

Concerning the formation of the interconnections hierarchically, the selection transistor S11 or S21 on the drain side separates the non-selected units from the main bit lines BL1 and BL2, therefore the capacity of the main bit line is considerably reduced, which is advantageous for the increase of speed and lowering of power consumption. Further, the selection transistor S12 or S22 on the source side act to separate the sub source line SSL from the main source line MSL and lower the capacity.

By adopting a pseudo contactless structure, the unit area of a NOR type memory cell can be made smaller.

Further, by using trench isolation technology, self-aligned fabrication technology (for example, the technology for self-aligned contact formation used in miniature NOR type memory cells) etc., a memory cell area of about $6F^2$ (F is the smallest design rule) can be achieved. The sub bit line SBL or the sub source line SSL is formed by a diffusion layer or a diffusion layer to which a silicide is adhered. Metal interconnections are used for main bit lines BL1 and BL2.

By using a full channel write/erase operation, since it is not necessary to use a double diffusion layer structure for suppressing a band to band tunnel current in the drain or source diffusion layer, the scaling property of the source/ drain diffusion layer of the memory transistor is superior in comparison with the operation of draining a stored charge out of the diffusion layer. As a result, the scaling of miniature of the memory cells is excellent, therefore a finer gate length memory transistor can be realized.

In memory cells of this circuit configuration as well, an erroneous read inhibit operations of the selected memory cell and the non-selected memory cells according to the previous embodiment are substantially similarly applied.

Note that the present invention can also be applied even in the case of another structure in which bit lines or source lines are formed hierarchically, for example, DINOR type memory cells, and miniature NOR type memory cells called the "HiCR type" comprised of a separated source type memory cell array in which a source line is shared by two adjoining source regions.

By the increase of the read disturb margin of the MONOS type memory transistor explained above, the realization of a single-transistor memory cell using only one transistor for a memory cell is facilitated. For this realization, other than the increase of the disturb margin, it is necessary to adopt an enhancement type memory cell in which the gate threshold voltage of the memory transistor does not become depleted.

In the present nonvolatile semiconductor memory device, by making the tunnel insulating film relatively thick, at the time of erasing, a memory characteristic saturated by enhancement is obtained, which is preferred for a single-memory-transistor memory cell.

Further, in the present method of reading, since reading is performed in the state with the source biased even with the gate threshold voltage of the depletion region, it is de facto possible to read the data in the enhancement region. In this sense, a single-transistor structure is further easily achieved.

Further, since the tunnel insulating film can be made relatively thick, the injection of holes is suppressed, therefore deterioration of the tunnel insulating film by the holes is prevented and an improvement of the repetition characteristic (endurance characteristic) of write/erase operations can be expected.

In a single-transistor memory cell, it is not necessary to arrange a selection transistor for every memory cell, so a reduction of the memory cell area and consequently a reduction of cost by the reduction of the chip area and an increase of capacity can be achieved. As a result, it becomes possible to realize a large capacity MONOS type nonvolatile memory of a memory cell area equivalent to the NOR type, AND type, NAND type, or DINOR type of a FG type nonvolatile memory at a low cost.

Second Embodiment

In the present embodiment, a modification of the MONOS type nonvolatile memory device will be shown.

Figure 17:
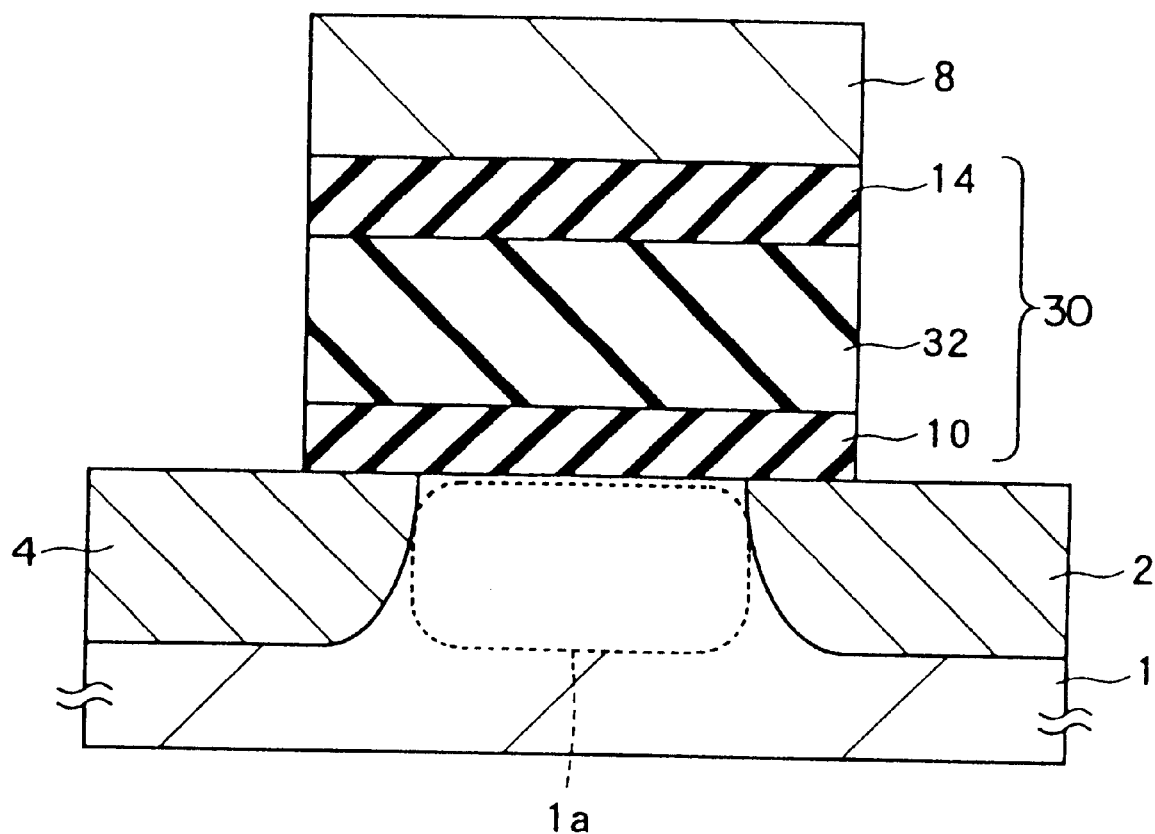
FIG. 17 is a sectional view of the element structure of a MONOS type memory transistor according to a second embodiment of the present invention.

FIG. 17 is a sectional view of an element structure of this MONOS type memory transistor. The difference of the MONOS type nonvolatile memory of the present embodiment from the previous first embodiment resides in that a gate insulating film 30 of the present embodiment is provided with an oxynitride film 32 (SiOxNy, 0<x<1, 0<y<1) in place of the nitride film 12. The rest of the structure, that is, the semiconductor substrate 1, source region 2, drain region 4, channel forming region 1a, tunnel insulating film 10, top oxide film 14, and gate electrode 8, is similar to that of the first embodiment.

The oxynitride film 32 has a thickness of for example 5.0 nm. Further, the tunnel insulating film 10 in the present example is slightly thinner than that of the first embodiment and can be appropriately selected within a range of from 2.0 nm to 3.0 nm in accordance with the purpose of use. Here, a thickness of about 2.5 nm is adopted. The same is true also in the case where an $SiO_2$ film is used for the tunnel insulating film 10 in the first embodiment.

In the manufacture of a memory transistor of such a structure, after the formation of the tunnel insulating film 10, for example the low pressure CVD process is used to deposit the oxynitride film 32 thicker than 5.0 nm so that the final film thickness becomes 5.0 nm. This CVD is carried out by using an introduction gas obtained by mixing for example dichlorosilane (DCS), ammonia, and $N_2O$ and at a substrate temperature of 650° C. In the formation of the SiOxNy film on this thermally oxidized film, in the same way as the first embodiment, the pretreatment (wafer pretreatment) of the underlying surface and the film formation conditions are optimized according to need. Thereafter, similar to the first embodiment, after forming the top oxide film 14 and gate electrode material, electrode processing, etc., the related MONOS type memory transistor is completed.

Note that in the present embodiment, in the formation of the oxynitride film 32 forming the charge storing means, it is also possible to dope oxygen into a silicon nitride film to form the SiOxNy film.

The circuit configuration shown in FIG. 2 is applied as it is in the present embodiment as well. At the time of a read operation similar to the first embodiment, the non-selected column bias voltage is applied to the source and drain of the non-selected memory cell A and/or the source line bias voltage is supplied to the selected memory cell S and, if necessary, voltage is supplied to the non-selected word lines.

The endurance characteristic of this prepared memory transistor was investigated in the same way as the case of FIG. 6. As a result, a sufficient $V_{th}$ window width was obtained even after $10^6$ endurance W/E cycles.

Further, the read disturb characteristics of the non-selected memory cells A to C and the selected memory cell after the endurance W/E cycles were investigated. This investigation was carried out in the same way as that in FIG. 7 to FIG. 9. A similar result, that is, a window width of 0.5V or more of the gate threshold voltage $V_{th}$ after 10 years in the erased state could be achieved even in any selected memory cell and any non-selected memory cell. Further, it was seen that the selected memory cell S could be read after 10 years. The results suggest the efficacy of the present invention even in the 0.18 μm and subsequent generations.

The breakdown voltage was similarly studied in the same way as FIG. 10 and FIG. 11 and was found to be good. Further, the principal device characteristic, that is, the current voltage characteristic, was evaluated for the cut-off region (FIG. 12) and the gate voltage dependency (FIG. 13, FIG. 14). The endurance characteristic and the data retention characteristic were also evaluated in the same way as the first embodiment. As a result, satisfactory results similar to the first embodiment were obtained in all instances.

Note that also in the present embodiment, in the same way as the previous first embodiment, it is possible to realize a miniature NOR type memory cell having a small chip area (for example about 6 $F^2$ (F: smallest design width)) by using a NOR type memory cell using the self-aligned technique and a serpentine source line or a NOR type memory cell in which bit lines and/or source lines are formed hierarchically.

In the present embodiment as well, similar effects to those by the previous first embodiment are obtained.

Namely, for the non-selected memory cell A, as a result of reduction of the electric field applied on the tunnel insulating film 10 thereof, the soft write of the non-selected memory transistor M21 in the erased state is effectively prevented and the read disturb characteristic of the non-selected memory cell A is improved. Further, high speed reading becomes possible by the amount by which the read gate voltage can be made higher. On the other hand, for the selected memory cell S, the gate threshold voltage $V_{th}$ lowered due to the deep erase operation or roll-off in the erased state is improved and, as a result of this, the conventional problem can be avoided. Further, by supplying a bias voltage to the selected source line, the electric field applied on the ONO film of the selected memory transistor is reduced, so it becomes possible to improve the read disturb characteristic of the selected memory cell S. Further, it becomes possible to raise the voltage of the non-selected word line WL2 and as a result the enhancement of the disturb characteristics of the non-selected memory cells B and C becomes possible.

These effects are valid also in the 0.18 μm and subsequent generations. There is no influence upon the transistor breakdown voltage and the principal device characteristic.

By this increase of the read disturb margin, in various senses similar to the first embodiment, the realization of a MONOS NOR type single-transistor memory cell is facilitated. Further, it becomes possible to achieve an improvement of the endurance characteristic, a reduction of cost, and an enlargement of the capacity.

Third Embodiment

The present embodiment shows a nonvolatile semiconductor memory device using a large number of Si nanocrystal buried in the gate insulating film as the charge storing means of the memory transistor (hereinafter referred to as an Si nanocrystal type). The Si nanocrystal preferably have a particle size of not more than 10 nanometers.

Figure 18:
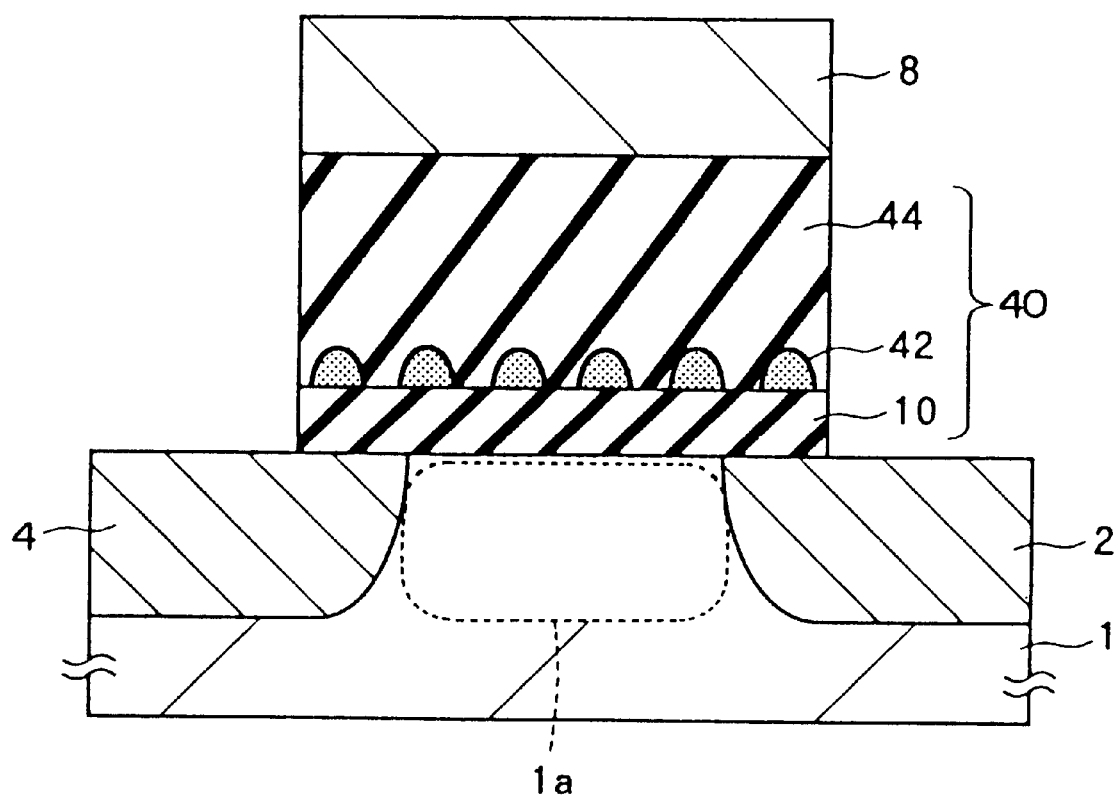
FIG. 18 is a sectional view of the element structure of an Si nanocrystal type memory transistor according to a third embodiment of the present invention.

FIG. 18 is a sectional view of the element structure of this Si nanocrystal type memory transistor. The difference of the Si nanocrystal type nonvolatile memory of the present embodiment from the previous first embodiment resides in that, as the gate insulating film 40 of the present embodiment, in place of the nitride film 12 and the top oxide film 14, Si nanocrystals 42 serving as the charge storing means on the tunnel insulating film 10 and an oxide film 44 on this are formed between this and the gate electrode 8. The rest of the structure, that is, the semiconductor substrate 1, source region 2, drain region 4, channel forming region 1a, tunnel insulating film 10, and gate electrode 8 are similar to those of the first embodiment.

The Si nanocrystals 42 have a size (diameter) of for example about 4.0 nm. The individual Si nanocrystals are spatially isolated from each other at the oxide film 44 by for example about 4 nm. The tunnel insulating film 10 in the present example is slightly thicker than that of the first embodiment due to the fact that the charge storing means (Si nanocrystals 42) is near the substrate side and can be appropriately selected within a range from 2.6 nm to 4.0 nm according to the purpose of use. Here, a film thickness of about 3.2 nm was adopted.

In the manufacture of a memory transistor of such a structure, after the formation of the tunnel insulating film 10, by for example, the low pressure CVD process, a plurality of Si nanocrystals 42 are formed on the tunnel insulating film 10. Further, the oxide film 44 is formed by the low pressure CVD to for example about 7 nm in a manner burying the Si nano crystals 42. In this low pressure CVD, the material gas is a gas mixture of DCS and $N_2O$, and the substrate temperature is set at for example 700° C. At this time, the Si nanocrystals 42 are buried in the oxide film 44, and the surface of the oxide film 44 is flattened. Where the flattening is insufficient, a flattening process (for example, CMP) may be newly carried out. Thereafter, after the formation of the gate electrode material, the electrode processing, etc., the related Si nanocrystal type memory transistor is completed.

The Si nanocrystals 42 formed in this way act as planarly dispersed carrier traps. The trap level thereof can be estimated by a discontinuous band value with the peripheral silicon oxide. In the estimated value thereof, it is regarded to be about 3.1 eV. Individual Si nanocrystals 42 of this size can hold a few injection electrons.

The circuit configuration shown in FIG. 2 is applied as it is also in the present embodiment. At the time of a read operation similar to the first embodiment, the non-selected column bias voltage is supplied to the source and drain of the non-selected memory cell A and/or source line bias voltage is supplied to the selected memory cell S and, in accordance with need, voltage is supplied to the non-selected word lines.

The Si nano crystal type nonvolatile memory of this structure was, first, investigated as to the data retention characteristic by the back tunneling model of Landquist. In order to improve the data retention characteristic, it becomes important to make the trap level deep and increase the distance between the center of the charge and the substrate 1. Therefore, by simulation using the Landquist model as a physical model, the data retention characteristic when the trap level was 3.1 eV was investigated. As a result, it was seen that by using deep carrier traps of a trap level of 3.1 eV, a good data retention characteristic was shown even in a case where the distance from the charge holding medium to the channel forming region 1a was relatively short, i.e., 3.2 nm.

Subsequently, the low voltage programming in the a-write/erase operation, another important characteristic, was investigated. The write time in the present example is 1 msec or less with a low program voltage of 5V as the program voltage, so the high speed write property of the Si nanocrystal type could be proved.

The endurance characteristic of this prepared memory transistor was investigated similar to the case of FIG. 6. As a result, a sufficient $V_{th}$ window width was obtained even after $10^6$ endurance W/E cycles.

Further, the read disturb characteristics of the non-selected memory cells A to C after endurance W/E cycles were investigated. This investigation was carried out similar to FIG. 7 to FIG. 9. It was seen that a window width of 0.5V or more gate threshold voltage $V_{th}$ after 10 years in the erased state could be achieved even in the selected memory cell and any non-selected memory cell, and the selected memory cell could be continuously read after 10 years. This result suggests the efficacy of the present invention even in the 0.18 μm and subsequent generations.

The breakdown voltage was also investigated in the same way as in FIG. 10 and FIG. 11 and was found to be good. Further, the principal device characteristic, that is, the current-voltage characteristic, was evaluated for the cut-off region (FIG. 12) and the gate voltage dependency (FIG. 13, FIG. 14). The endurance characteristic and the data retention characteristic were evaluated similar to the first embodiment. As a result, satisfactory results similar to the first embodiment were obtained in all cases.

Note that in the present embodiment as well, similar to the previous first embodiment, it is possible to realize a miniature NOR type memory cell having a small chip area (for example about 6 $F^2$ (F: minimum design rule)) by using a NOR type memory cell using the self-aligned technique and the serpentine source line or a NOR type memory cell in which bit lines and/or source lines are formed hierarchically.

In the present embodiment as well, similar effects to those by the previous first embodiment are obtained.

Namely, for the non-selected memory cell A, as a result of reduction of the electric field applied on the tunnel insulating film 10 thereof, the soft write of the non-selected memory transistor N21 in the erased state is effectively prevented and the read disturb characteristic of the non-selected memory cell A is improved. Further, high speed reading becomes possible by the amount by which the read gate voltage can be made higher. On the other hand, for the selected memory cell S, the gate threshold voltage $V_{th}$ lowered due to the deep erase operation or roll-off in the erased state is improved and, as a result of this, the conventional problem can be avoided. Further, by supplying a bias voltage to the selected source line, the electric field applied to the tunnel insulating film of the selected memory transistor is reduced, so it becomes possible to improve the read disturb characteristic of the selected memory cell S. Further, it becomes possible to raise the voltage of the non-selected word line WL2 and as a result the enhancement of the disturb characteristics of the non-selected memory cells B and C becomes possible.

These effects are valid also in the 0.18 μm and subsequent generations. There is no influence upon the transistor breakdown voltage and the principal device characteristic.

By this increase of the read disturb margin, in various senses smaller to the first embodiment, the realization of a single-transistor memory cell is facilitated. Further, it becomes possible to achieve an improvement of the endurance characteristic, a reduction of cost, and an enlargement of the bit capacity.

Fourth Embodiment

The present embodiment shows the case where a memory transistor of the gate electrode structure substantially the same as the first embodiment is formed on the SOI substrate.

Figure 19:
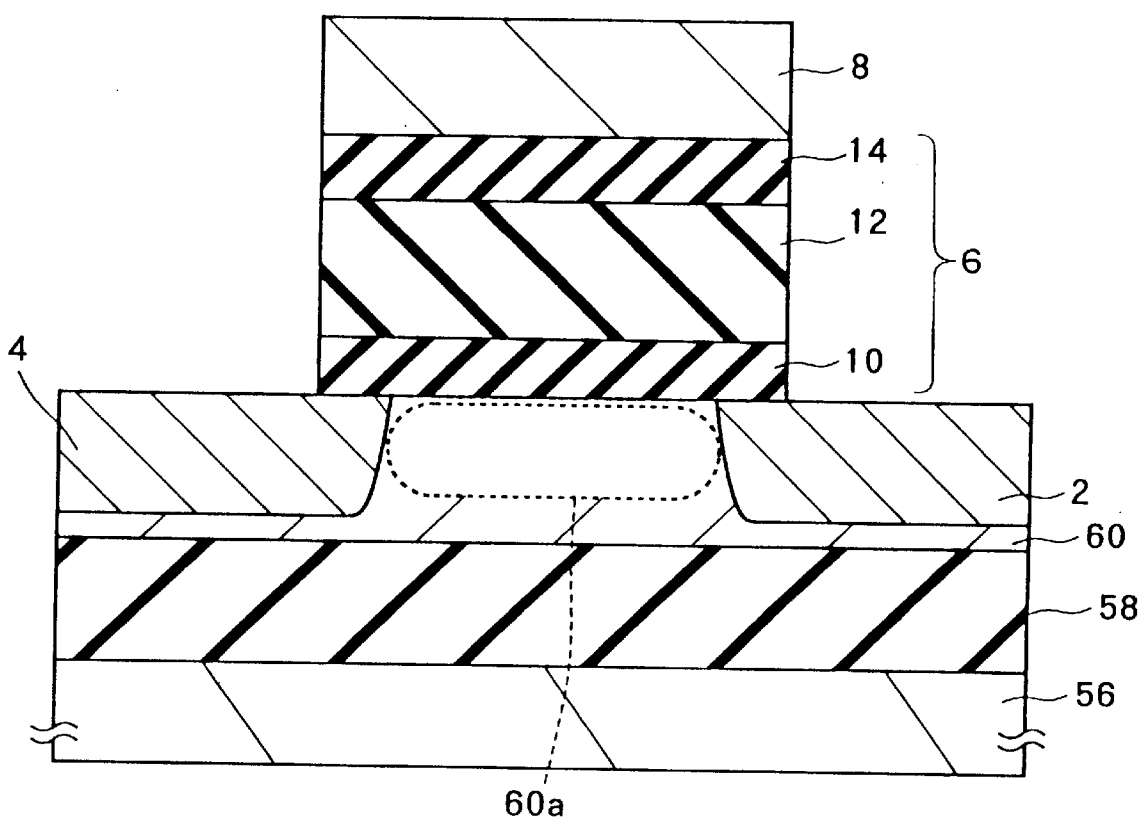
FIG. 19 is a sectional view of the element structure of a MONOS type memory transistor having an SOI insulation and isolation structure according to a fourth embodiment of the present invention.

FIG. 19 is a sectional view of the element structure of a MONOS type memory transistor of the SOI insulation and isolation structure. The difference of the MONOS type nonvolatile memory of the SOI insulation and isolation structure of the present embodiment from the previous first embodiment resides in that the memory transistor is formed on the SOI substrate. The rest of the structure, that is, the source region 2, drain region 4, tunnel insulating film 10, nitride film 12, top oxide film 14, and gate electrode 8 are similar to those of the first embodiment.

As the SOI substrate, a SIMOX (separation by implanted oxygen) substrate obtained by implanting oxygen ions into a silicon substrate is used. SIMOX substrate has high concentration and forming a burying oxide film at a deeper position than the substrate surface, a bonded substrate obtained by forming an oxide film on one silicon substrate surface and bonding this to another substrate, etc. The SOI substrate formed by such a method and shown in FIG. 19 is constituted by a semiconductor substrate 56, an isolation oxide film 58, and a silicon layer 60 (element isolation and forming region). In the silicon layer 60, a channel forming region 60a, source region 2, and drain region 4 are provided.

In the manufacture of a memory transistor of such a structure, steps other than the formation of the tunnel insulating film 10 on the SOI substrate were already explained in the first embodiment and therefore the explanation will be omitted here.

The circuit configuration shown in FIG. 2 is applied as it is in the present embodiment as well. At the time of a read operation similar to the first embodiment, the non-selected column bias voltage is supplied to the source and drain of the non-selected memory cell A and/or the source line bias voltage is supplied to the selected memory cell S and, if necessary, voltage is supplied to the non-selected word lines.

The effect of using the SOI substrate, that is, the high speed property and low power consumption, for this prepared memory transistor were evaluated by preparing a prototype of the element and evaluating its characteristics. As a result, it was confirmed that good characteristics could be obtained. Concerning the data rewrite speed, the write time was 0.2 ms and the erasing time 50 ms by erasing a block all together.

Further, the endurance characteristic was investigated similar to the case of FIG. 6. As a result, a sufficient $V_{th}$ window width was obtained even after $10^6$ endurance W/E cycles.

Further, the read disturb characteristics of the non-selected memory cells A to C after endurance W/E cycles were investigated. This investigation was carried out similar to FIG. 7 to FIG. 9. It was seen that a window width of 0.5V or more of gate threshold voltage $V_{th}$ after 10 years in the erased state could be achieved in either of the selected memory cell S and any non-selected A memory cell and the selected memory cell could be continuously read after 10 years. Further, the result suggested the efficacy of the present invention even in the 0.18 µm and subsequent generations.

The breakdown voltage was similarly studied in the same way as FIG. 10 and FIG. 11 and was found to be good. Further, the principal device characteristic, that is, the current voltage characteristic, was evaluated for the cut-off region (FIG. 12) and the gate voltage dependency (FIG. 13, FIG. 14). The endurance characteristic and the data retention characteristic were also evaluated in the same way as the first embodiment. As a result, satisfactory results similar to the first embodiment were obtained in all instances.

Note that also in the present embodiment, in the same way as the previous first embodiment, it is possible to realize a miniature NOR type memory cell having a small chip area (for example about 6 $F^2$ (F: minimum design rule)) by using a NOR type memory cell using the self-aligned technique and a serpentine source line or a NOR type memory cell in which bit lines and/or source lines are formed hierarchically.

In the present embodiment as well, similar effects to those by the previous first embodiment are obtained.

Namely, for the non-selected memory cell A, as a result of reduction of the electric field applied on the tunnel insulating film 10 thereof, the soft write of the non-selected memory transistor M21 in the erased state is effectively prevented and the read disturb characteristic of the non-selected memory cell A is improved. Further, high speed reading becomes possible by the amount by which the read gate voltage can be made higher. On the other hand, for the selected memory cell S, the gate threshold voltage $V_{th}$ lowered due to the deep erase operation or roll-off in the erased state is improved and, as a result of this, the conventional problem can be avoided. Further, by supplying a bias voltage to the selected source line, the electric field applied to the ONO film of the selected memory transistor is reduced, so it becomes possible to improve the read disturb characteristic of the selected memory cell S. Further, it becomes possible to raise the voltage of the non-selected word line WL2 and as a result the enhancement of the disturb characteristics of the non-selected memory cells B and C becomes possible.

These effects are valid also in the 0.18 µm and subsequent generations. There is no influence upon the transistor breakdown voltage and the principal device characteristic.

By this increase of the read disturb margin, in various senses similar to the first embodiment, the realization of a MONOS NOR type single-transistor memory cell is facilitated. Further, it becomes possible to achieve an improvement of the endurance characteristic, a reduction of cost, and an enlargement of the bit capacity.

Fifth Embodiment

The present embodiment relates to a method of page reading. During page reading the memory transistor, the conditions of the source and drain bias voltage including the relationship with the threshold voltage in the erased state with the aim of a further improvement of the read disturb characteristic of the selected memory cell S were clarified.

The present embodiment relates to the read disturb suppression technique in so-called page reading for reading in parallel information of memory cells written in parallel.

In this case, non-selected memory cells A in FIG. 2 (memory cells connected to the selected word line) are all handled in the same way as the selected memory cell S for the page reading for parallel reading.

The element structure of the memory transistor is similar to that of the first embodiment.

In this method of reading, preferably, the source bias voltage Vs and the read gate voltage Vg are determined alternately or so as to satisfy the following factors in relationship with the threshold voltage in the erased state:

(1) The source bias voltage Vs is smaller than the read gate voltage Vg.

(2) The gate read voltage Vg is the same as or larger than the read drain voltage.

(3) The threshold voltage $V_{th}(E)$ in the erased state takes a value of 0V or more (0V or positive).

For example, where the threshold voltage $V_{th}(E)$ of the erased state is set at 0.5V to 1.0V, the source bias voltage Vs becomes 1V or less. The read gate voltage in this case becomes about 1.5V and becomes larger than the source bias voltage Vs.

The read drain voltage tends to be gradually lowered together with the scaling of the gate length. On the other hand, the read gate voltage Vg must be made sufficiently large with respect to the threshold voltage $V_{th}(E)$ in the erased state. As a result, the read gate voltage Vg becomes the same or larger when compared with the read drain voltage.

The preferred range of thickness of the tunnel insulating film 10 (refer to FIG. 1) in the first embodiment was determined to 2.0 nm to 3.6 nm, but here the film is made slightly thicker, i.e., 2.3 nm or more. When the tunnel insulating film 10 is made thicker, the probability of tunneling of charge in the tunnel insulating film 10 can be reduced and as a result the read disturb can be further suppressed.

Figure 20:
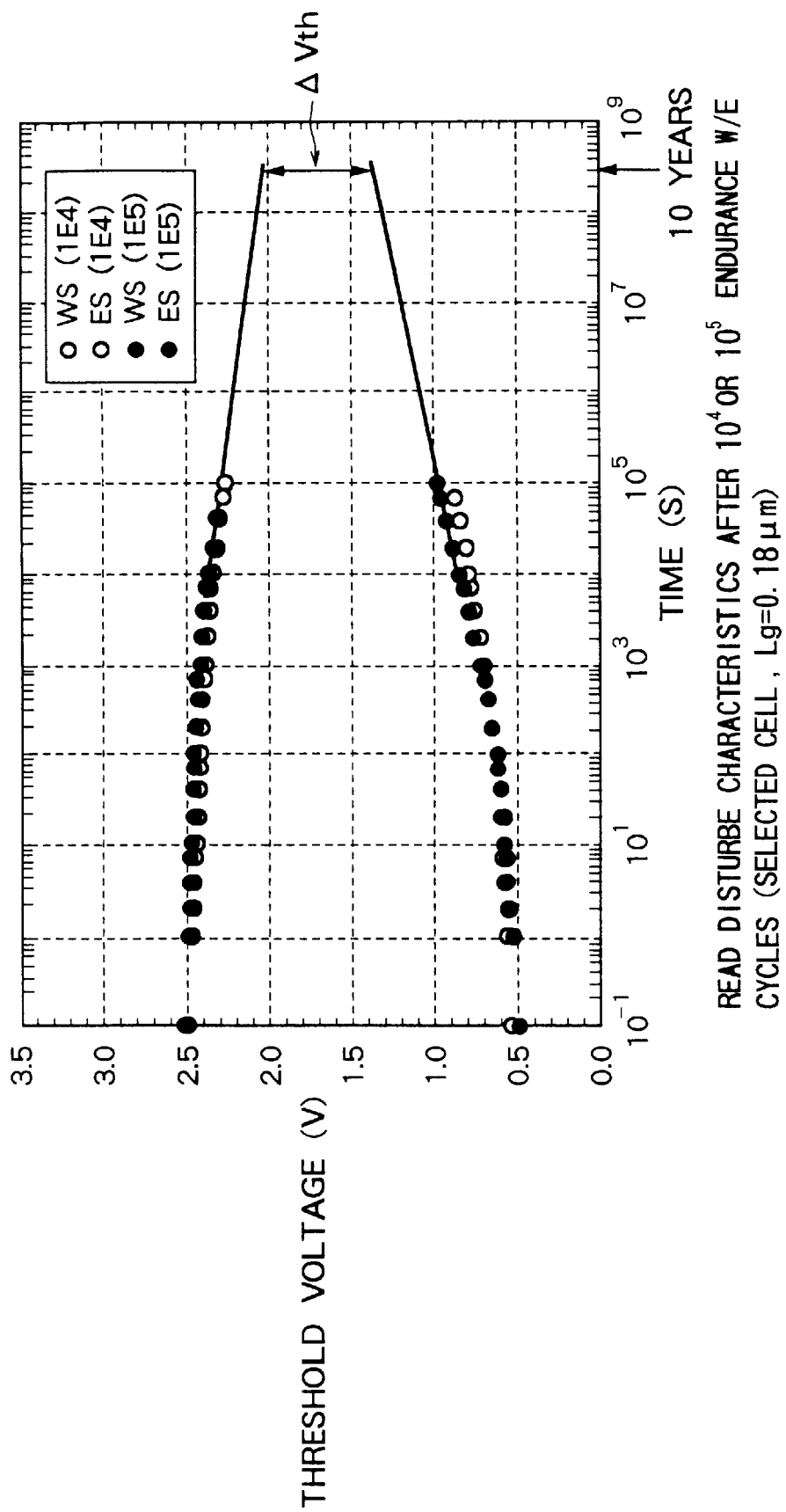
FIG. 20 is a graph of the read disturb characteristic of a selected memory cell S after $10^4$ and $10^5$ endurance W/E cycles in a MONOS type memory cell having a gate length of 0.18 μm according to a fifth embodiment of the present invention.

FIG. 20 shows the read disturb characteristic of the selected memory cell S after $10^4$ endurance W/E cycles or $10^5$ endurance W/E cycles in a MONOS type memory having a gate length of 0.18 µm.

It was found from this FIG. 20 that the window width of the threshold voltage after 10 years found by linear extrapolation based on experimental values was limited at least 0.5V of the detection limit of the sense amplifier. Further, it was found that the threshold voltage $V_{th}(W)$ in the written state was higher than the 1.5V of the read gate voltage even after 10 years.

It was seen from the above that the data could be continuously read after 10 years even if the data was rewritten 100,000 times. Further, it was seen that the data could be read after 10 years even after $10^6$ endurance W/E cycles.

Figure 21:
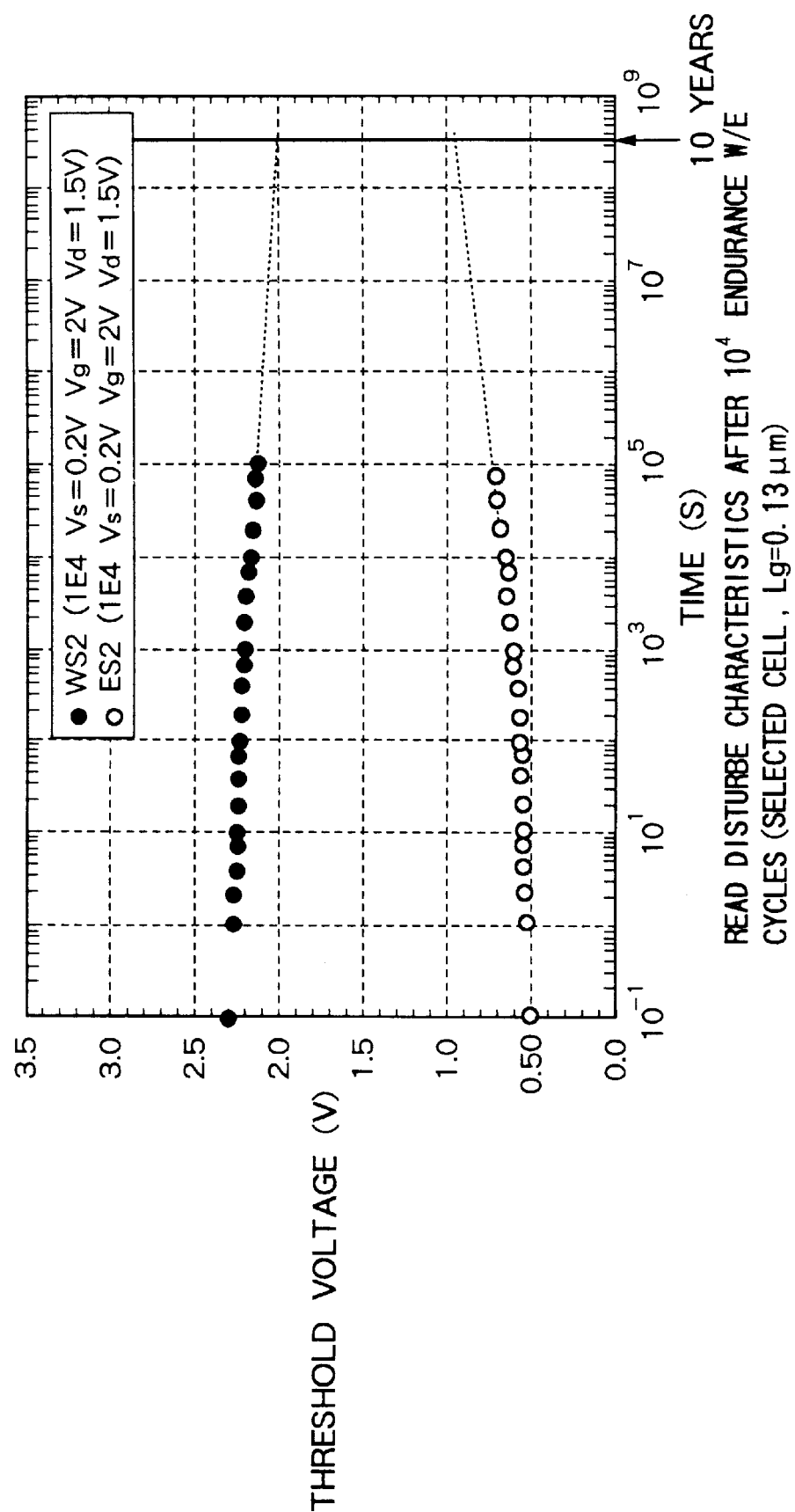
FIG. 21 is a graph of the read disturb characteristic of a selected memory cell S after $10^4$ endurance W/E cycles in a MONOS type memory cell having a gate length of 0.13 μm according to the fifth embodiment of the present invention.

FIG. 21 shows the read disturb characteristic of the selected memory cell S after $10^6$ endurance W/E cycles in a MONOS type memory having a gate length of 0.13 µm.

The result is for the case where the number of data rewrites was 10,000, but the window width and the margin of the threshold voltage $V_{th}(W)$ in the written state with respect to the read gate voltage are sufficiently large when compared with FIG. 20. This result suggests that the read disturb characteristic necessary after $10^6$ endurance W/E cycles can be guaranteed even if the gate length is 0.13 µm.

Figure 22:
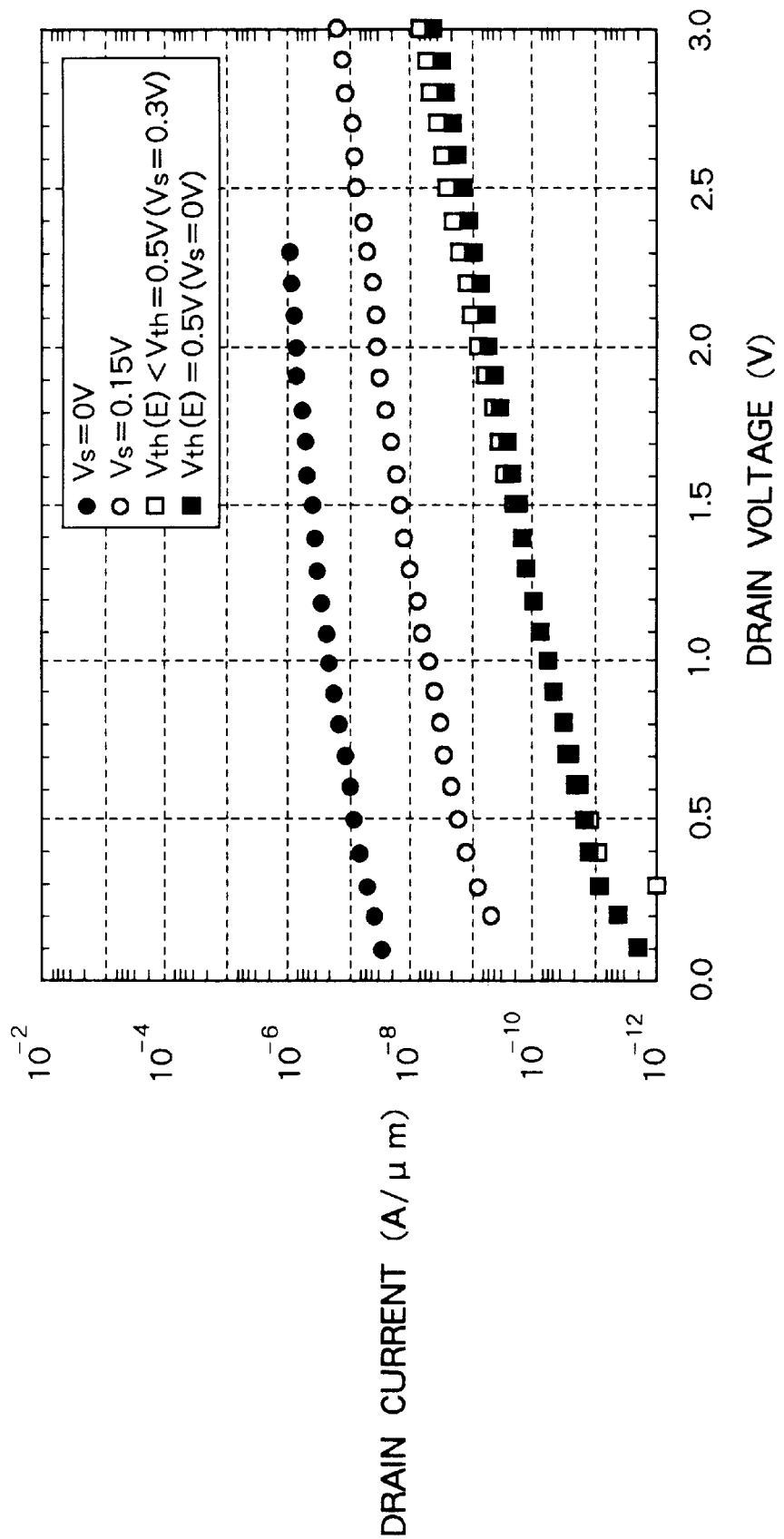
FIG. 22 is a graph of a source bias voltage dependency of the drain current (leakage current) when the non-selected memory cell C is brought to a cut-off state (gate application voltage Vg=0V) in a MONOS type memory cell having a gate length of 0.18 μm according to the fifth embodiment of the present invention.

FIG. 22 shows a source bias voltage dependency of the drain current (leakage current) when the non-selected memory cell C in the MONOS type memory having the gate length of 0.18 µm is brought to the cut-off state. In FIG. 22, an abscissa indicates the drain voltage, and an ordinate indicates a leakage current per unit gate width. This voltage-current characteristic was measured by changing the source bias voltage Vs to 0V, 0.15V, and 3V as a parameter.

It is found from this FIG. 22 that the leakage current is decreased as the source bias voltage Vs becomes larger. Further, it is seen that the leakage current substantially does not change if the threshold voltage $V_{th}(E)$ in the erased state where no source bias is given (Vs=0V) and the threshold voltage $V_{th}$ after giving a source bias (Vs=0.3V) were the as same as 0.5V.

Figure 23:
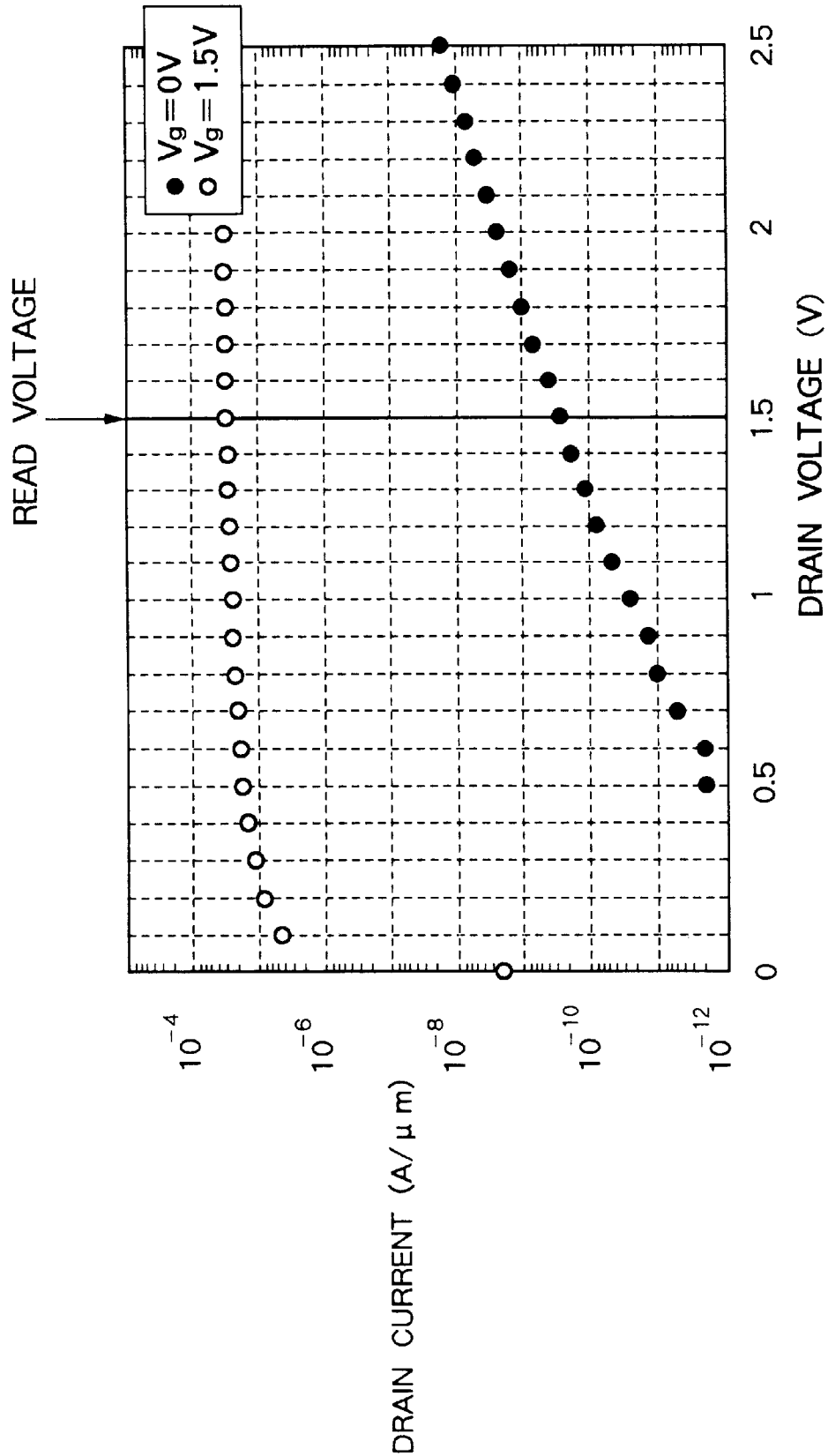
FIG. 23 is a graph of a read current from the selected memory cell S (drain current when the gate application voltage Vg=1.5V) and a leakage current from the non-selected memory cell C (drain current when the gate application voltage Vg=0V) in a MONOS type memory cell having a gate length of 0.18 μm according to the fifth embodiment of the present invention.

FIG. 23 shows the read current (drain current when the gate application voltage Vg=1.5V) from the selected memory cell S in a MONOS type memory having a gate length of 0.18 µm and the leakage current (drain current when the gate application voltage Vg=0V) from the non-selected memory cell C.

It is found from this FIG. 23 that the read current when the drain read voltage is 1.5V is higher than the leakage current by five orders of magnitude. One string is constituted by 100 memory cells. Even if the leakage current of the non-selected memory cells C occupying most of this is added, the read current can be made higher by about three orders of magnitude with respect to the added leakage current.

As a result of the above, in the source bias reading in a MONOS type memory having a gate length of 0.18 µm, it could be confirmed that the source bias was effective for the reduction of the leakage current of the non-selected memory cell C, a sufficient ratio of the read current with respect to the leakage current could be obtained in practice, and a stable read operation was possible.

Further, in the above explanation, the threshold voltage in the erased state was set at 0V or more, but even in the case where the threshold voltage in the erased state is negative, the present invention can be applicable.

It was seen from above that page reading was possible in a MONOS-NOR type single-transistor memory cell by using the present technique.

Further, it was confirmed that this source bias reading technique was effective for the reading of a MONOS type single-transistor memory cell having a gate length of 0.13 µm.

This source bias reading technique can be effectively applied also to the nonvolatile semiconductor memory transistors shown in the second to fourth embodiments.

Note that, in the above first to fifth embodiments, the explanation was made of a nonvolatile semiconductor memory in which the charge storing means in the gate insulating film was made planarly dispersed, but needless to say the present invention can be applied to even a nonvolatile semiconductor memory of the floating gate type (FG type) in which the charge storing means is not made dispersed, particularly a FG type nonvolatile memory having a gate length of 0.14 µm or less using an SOI substrate or the single electron type nonvolatile memory.

Further, research and development are being conducted on multilevel memories for storing 2 or more bits of information in one memory cell, but in the case of a multilevel memory, the $V_{th}$ window width per bit becomes small and the read disturb characteristic, data retention characteristic, etc. become much severer in comparison with an FG type binary memory. For this reason, particularly, it is clear that the present invention is effective for the enhancement of the read disturb characteristic of a FG type multilevel memory.

In the nonvolatile semiconductor memory device of the present invention and a method of reading the same, by supplying voltage to the source and/or drain of the non-selected column memory transistors, the intensity of the electric field applied to the gate insulating film can be substantially reduced and, as a result, soft write of the non-selected column memory transistors in the erased state is effectively prevented and the read disturb characteristic of the transistors is improved.

Further, the voltage supplied to the selected word line can be made high within a range where there is no problem in this read disturb characteristic, therefore the memory cell current can be increased and higher speed reading becomes possible by that amount.

On the other hand, by just somewhat raising the source voltage of the selected memory transistor, the gate threshold voltage of the selected memory transistor can be raised exceeding that rise. For this reason, the leakage current from the non-selected memory cells connected to the selected bit line can be reduced, and a certain, highly reliable read operation becomes possible even in a miniature gate.

Further, since the electric field applied on the gate insulating film of the selected memory transistor is reduced by raising the source voltage, the read disturb characteristic of the selected memory cell can be improved. Further, the read disturb characteristic of the selected memory cell can be improved also by making the tunnel insulating film relatively thick.

Further, it becomes possible to raise the non-selected word line voltage up to almost the same voltage as this source bias voltage, and as a result, it becomes possible to prevent the deterioration of or improve the disturb characteristic of the non-selected row memory transistors.

From the above, due to this art, one-bit reading or page reading becomes possible in a MONOS single-transistor memory cell, therefore the replacement of two-transistor memory cells by single-transistor memory cells is facilitated.

The improvement of the read disturb characteristic of the non-selected column memory transistors means on the one hand that the selected word line voltage can be made high to a certain extent. In this case, the tunnel insulating film can be made relatively thick and an improvement of the data retention characteristic can be expected. In addition, data reading in the enhancement region is substantially possible by biasing the source in the present invention. Together with this, this contributes to the formation of a single-transistor memory cell.

What is claimed is:

1. A nonvolatile semiconductor memory device comprising:

a substrate;

a plurality of memory transistors formed in the vicinity of the surface of the substrate in a matrix form, each transistor including a semiconductor channel forming region formed in the vicinity of the surface of the substrate, a source region formed in the vicinity of the surface of the substrate and in contact with that channel forming region, a drain region in contact with the channel forming region at a distance from the source region, a gate insulating film containing a tunnel insulating film formed in the channel forming region, a conductive gate electrode formed on the gate insulating film, and a charge storing means formed inside the gate insulating film; and a non-selected column biasing means for supplying a non-selected bias voltage having a voltage value between a source voltage when reading a data from the selected memory transistor and a voltage supplied to the gate of the selected memory transistor when reading, to the sources and/or drains of the non-selected column memory transistors arranged in columns not containing the selected memory transistor for reading the data therefrom.

2. A nonvolatile semiconductor memory device as set forth in claim 1, further comprising a selected memory transistor biasing means for supplying a voltage between the voltage supplied to the gate of the selected memory transistor when reading and a ground voltage to the source of the selected memory transistor to set the source voltage.

3. A nonvolatile semiconductor memory device as set forth in claim 2, further comprising a non-selected row biasing means for supplying a voltage substantially the same as or lower than the selected memory transistor biasing means to gates of the non-selected row memory transistors arranged in rows not containing the selected memory transistor.

4. A nonvolatile semiconductor memory device as set forth in claim 1, wherein the absolute value of the difference between the voltage supplied by the non-selected row biasing means and the voltage supplied to the gate of the selected memory transistor when reading is not more than 1V.

5. A nonvolatile semiconductor memory device as set forth in claim 1, wherein said non-selected row biasing means supplies the same voltage to the sources and drains of the non-selected row memory transistors.

6. A nonvolatile semiconductor memory device as set forth in claim 1, wherein the channel forming region of the memory transistor is not depleted to the center portion when the gate is the ground voltage.

7. A nonvolatile semiconductor memory device as set forth in claim 1, wherein the channel forming region of the memory transistor is not depleted to the center portion or the source region when the ground voltage is supplied to the gate and a predetermined drain read voltage is supplied to the drain.

8. A nonvolatile semiconductor memory device as set forth in claim 1, further comprising:

a source line for commonly connecting the sources of the plurality of memory transistors in the column direction, a bit line for commonly connecting the drains in the column direction, and a word line for commonly connecting the gates in the row direction, and said non-selected row biasing means being connected to said source line and/or bit line.

9. A nonvolatile semiconductor memory device as set forth in claim 2, further comprising:

a source line for commonly connecting the sources of the plurality of memory transistors in the column direction, a bit line for commonly connecting the drains in the column direction, and a word line for commonly connecting the gates in the row direction, said selected memory transistor biasing means being connected to the source line.

10. A nonvolatile semiconductor memory device as set forth in claim 3, further comprising:

a source line for commonly connecting the sources of the plurality of memory transistors in the column direction, a bit line for commonly connecting the drains in the column direction, and a word line for commonly connecting the gates in the row direction, said selected row biasing means being connected to the word line.

11. A nonvolatile semiconductor memory device as set forth in claim 8, wherein said source line comprises of a sub source line to which the source regions are connected and a main source line, wherein said bit line comprises of a sub bit line to which the drain regions are connected and a main bit line, wherein said memory device further comprises selection transistors between the sub source line and main source line and between the sub bit line and main bit line, and wherein the non-selected column bias voltage is supplied through the selection transistors to the main source line side and/or the main bit line side.

12. A nonvolatile semiconductor memory device as set forth in claim 8, further comprising a plurality of element isolation regions of a line shape in the bit line direction formed on the surface of the substrate a distance away from each other, and one of the source line or bit line being connected on one region to be connected among the source regions or drain regions and is laid in a serpentine manner on the element isolation regions so as to avoid the other regions.

13. A nonvolatile semiconductor memory device as set forth in claim 12, wherein the element isolation regions form parallel stripe shapes, self-aligned contact holes are formed in the source regions and drain regions by side wall insulating layers formed at side walls of the word line, and the one of the source line or bit line laid in a serpentine manner on the element isolation regions is laid in a serpentine manner while commonly connecting the other regions.

14. A nonvolatile semiconductor memory device as set forth in claim 1, wherein said charge storing means does not have conductivity as a plane as a whole facing the channel forming region when there is no movement of the charge with at least the outside.

15. A nonvolatile semiconductor memory device as set forth in claim 14, wherein the charge storing means is at least in the planarly dispersed facing the channel forming region.

16. A nonvolatile semiconductor memory device as set forth in claim 14, wherein said gate insulating film includes a tunnel insulating film on the channel forming region and a nitride film or an oxynitride film on the tunnel insulating film.

17. A nonvolatile semiconductor memory device comprising:

a substrate;

a plurality of memory transistors formed in the vicinity of the surface of the substrate in a matrix form, each transistor including a semiconductor channel forming region formed in the vicinity of the surface of the substrate, a source region formed in the vicinity of the surface of the substrate and in contact with that channel forming region, a drain region in contact with the channel forming region at a distance from the source region, a gate insulating film containing a tunnel insulating film formed in the channel forming region, a conductive gate electrode formed on the gate insulating film, and a charge storing means formed inside the gate insulating film;

gate electrodes of the plurality of memory elements being connected to a plurality of word lines, source regions or drain regions being connected to a common line in the bit line direction intersecting the word lines in an electrically insulated state, and a non-selected column biasing means for supplying to source regions and/or drain regions of the non-selected memory elements having gate electrodes connected to the selected word line when reading a data via the common line a voltage by which the related regions become reversely biased with respect to the channel forming region.

18. A nonvolatile semiconductor memory device as set forth in claim 17, further comprising a selected element biasing means for supplying to the common line connected to the source region of the memory element selected when reading a voltage of a direction becoming an reverse bias to the channel forming region of the memory element.

19. A nonvolatile semiconductor memory device as set forth in claim 18, further comprising a non-selected row biasing means for supplying to the non-selected word lines a voltage of a polarity becoming an reverse bias to the channel forming region and substantially the same as or lower than the voltage supplied to the selected element biasing means when reading.

20. A nonvolatile semiconductor memory device as set forth in claim 19, wherein the charge storing means is at least in the planarly dispersed facing the channel forming region.

21. A nonvolatile semiconductor memory device comprising:

a substrate;

a plurality of memory transistors formed in the vicinity of the surface of the substrate in a matrix form, each transistor including a semiconductor channel forming region formed in the vicinity of the surface of the substrate, a source region formed in the vicinity of the surface of the substrate and in contact with that channel forming region, a drain region in contact with the channel forming region at a distance e from the source region, a gate insulating film containing a tunnel insulating film formed in the channel forming region, a conductive gate electrode formed on the gate insulating film, and a charge storing means formed inside the gate insulating film; and a selected memory transistor biasing means for supplying to the source of the selected memory transistor for reading a data a voltage of a value between the voltage supplied to the gate of the selected memory transistor when reading and the ground voltage.

22. A nonvolatile semiconductor memory device comprising:

a substrate;

a plurality of memory transistors formed in the vicinity of the surface of the substrate in a matrix form, each transistor including a semiconductor channel forming region formed in the vicinity of the surface of the substrate, a source region formed in the vicinity of the surface of the substrate and in contact with that channel forming region, a drain region in contact with the channel forming region at a distance from the source region, a gate insulating film containing a tunnel insulating film formed in the channel forming region, a conductive gate electrode formed on the gate insulating film, and a charge storing means formed inside the gate insulating film;

a charge storing means formed inside the gate insulating film, and a selected memory transistor biasing means for supplying to the drain of the selected memory transistor for reading the information a reading drain voltage larger than the source voltage and less than or equal to the reading gate voltage supplied to the gate when reading.

23. A nonvolatile semiconductor memory device as set forth in claim 21, wherein the memory transistor has a threshold voltage when erasure of a value of 0V or a positive value.

24. A nonvolatile semiconductor memory device as set forth in claim 21, wherein the thickness of the tunnel insulating film is at least 2.3 nm.

* * * * *

UNITED STATES PATENT AND TRADEMARK OFFICE
CERTIFICATE OF COR

PATENT NO.    : 6,191,445 B1
DATED         : February 20, 2001
INVENTOR(S)   : Fujiwara It is certified that error appears in the above-identified patent and that said Letters Patent is hereby corrected as shown below:

Column 35,
Line 43, replace "an" with -- a --.

Column 36,
Line 12, directly following the word "distance" delete "e".
Line 20, directly following the word "data" delete "a".
Line 44, directly following the word "information" add -- of --.

Signed and Sealed this

Twentieth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,191,445 B1
DATED : February 20, 2001
INVENTOR(S) : Fujiwara

It is certified that error appears in the above-identified patent and that said Letters Patent is hereby corrected as shown below:

<u>Column 36,</u>
Line 40, delete "a charge storing means formed inside the gate insulating film,".

Signed and Sealed this

Ninth Day of September, 2003

JAMES E. ROGAN
*Director of the United States Patent and Trademark Office*